United States Patent
Ito

(10) Patent No.: US 9,219,123 B2
(45) Date of Patent: Dec. 22, 2015

(54) METHOD OF PRODUCING A NITRIDE SEMICONDUCTOR CRYSTAL WITH PRECURSOR CONTAINING CARBON AND OXYGEN, AND NITRIDE SEMICONDUCTOR CRYSTAL AND SEMICONDUCTOR DEVICE MADE BY THE METHOD

(71) Applicant: Sharp Kabushiki Kaisha, Osaka-shi (JP)

(72) Inventor: Shigetoshi Ito, Osaka (JP)

(73) Assignee: SHARP KABUSHIKI KAISHA, Osaka-shi (JP)

( * ) Notice: Subject to any disclaimer, the term of this patent is extended or adjusted under 35 U.S.C. 154(b) by 6 days.

(21) Appl. No.: 14/087,588

(22) Filed: Nov. 22, 2013

(65) Prior Publication Data

US 2014/0145202 A1 May 29, 2014

(30) Foreign Application Priority Data

Nov. 26, 2012 (JP) ................................. 2012-257430
Jan. 30, 2013 (JP) ................................. 2013-015159

(51) Int. Cl.
| | | |
|---|---|---|
| H01L 29/207 | (2006.01) | |
| H01L 29/20 | (2006.01) | |
| H01L 21/02 | (2006.01) | |
| C23C 16/18 | (2006.01) | |
| C23C 16/34 | (2006.01) | |
| C30B 25/02 | (2006.01) | |
| C30B 29/40 | (2006.01) | |

(52) U.S. Cl.
CPC ............ *H01L 29/2003* (2013.01); *C23C 16/18* (2013.01); *C23C 16/34* (2013.01); *C30B 25/02* (2013.01); *C30B 29/403* (2013.01); *H01L 21/0237* (2013.01); *H01L 21/0254* (2013.01); *H01L 21/0262* (2013.01); *H01L 21/02458* (2013.01); *H01L 21/02579* (2013.01); *H01L 29/207* (2013.01)

(58) Field of Classification Search
CPC ........................... H01L 29/207; H01L 29/2003
See application file for complete search history.

(56) References Cited

U.S. PATENT DOCUMENTS

| | | | | |
|---|---|---|---|---|
| 6,281,099 | B1 * | 8/2001 | Yoshida | .................. C30B 23/02 257/E21.1 |
| 2003/0155584 | A1 * | 8/2003 | Barber | .................... C30B 25/02 257/200 |
| 2005/0145918 | A1 * | 7/2005 | Gealy et al. | .................... 257/306 |
| 2006/0189018 | A1 * | 8/2006 | Yi et al. | .......................... 438/47 |
| 2010/0084742 | A1 * | 4/2010 | Sazawa | ................... H01L 29/78 257/615 |
| 2012/0025205 | A1 * | 2/2012 | Nakata | .............. H01L 21/02378 257/77 |

FOREIGN PATENT DOCUMENTS

JP      10-101496      4/1998

* cited by examiner

*Primary Examiner* — Thao X Le
*Assistant Examiner* — J. R. Oakley
(74) *Attorney, Agent, or Firm* — Morrison & Foerster LLP

(57) ABSTRACT

A method of producing a nitride semiconductor crystal uses a metal organic chemical vapor deposition process and offers good controllability with respect to a p-type nitride semiconductor crystal. To that end, an organic metal compound of a group III element, a hydride of nitrogen, and an organic compound having any of the partial structures C—C—O, C—C=O, C=C—O, C=C=O, C≡C—O, and C—O—C are used as source materials, and by a metal organic chemical vapor deposition process, C and O atoms are simultaneously introduced into the crystal to obtain p-type conductivity.

18 Claims, 14 Drawing Sheets

FIG.5 EXAMPLES OF ORGANIC COMPOUNDS HAVING BONDS C–C=O ($C_2H_4O$, $C_3H_6O$, $C_3H_2O$, $C_4H_2O_2$, $C_4H_4O_2$)

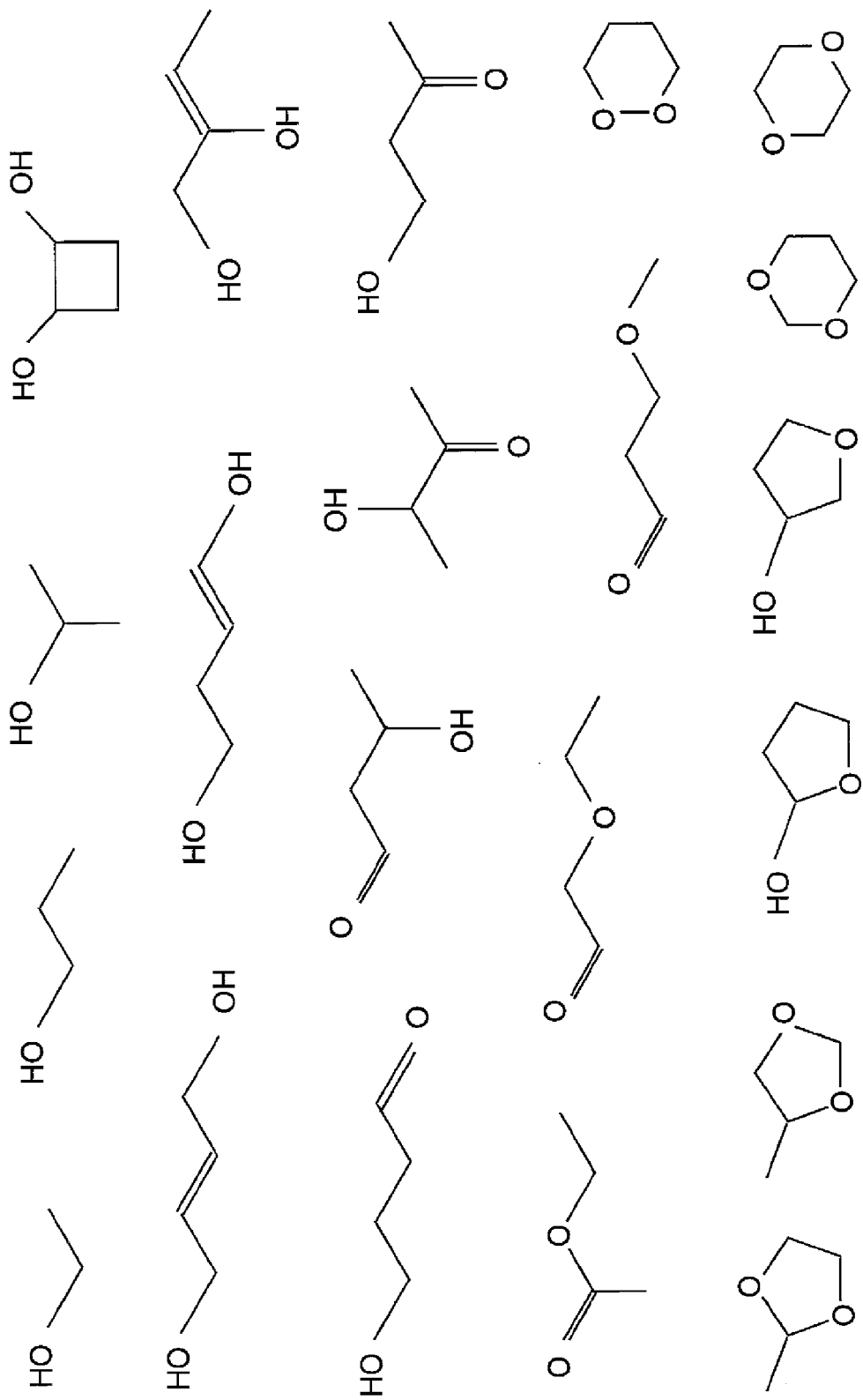

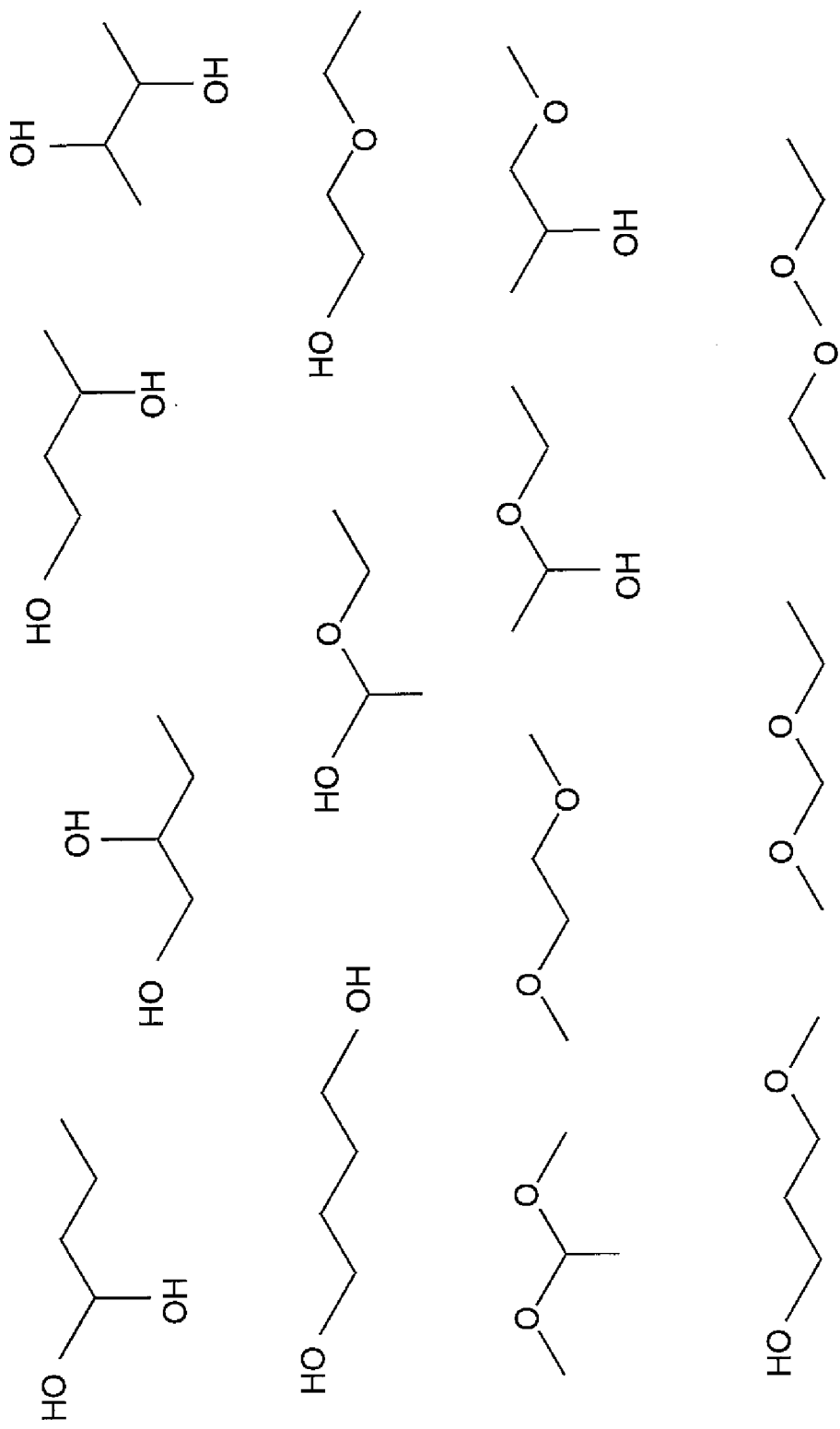
FIG.9 EXAMPLES OF ORGANIC COMPOUNDS HAVING BONDS C-C-O ($C_4H_{10}O_2$)

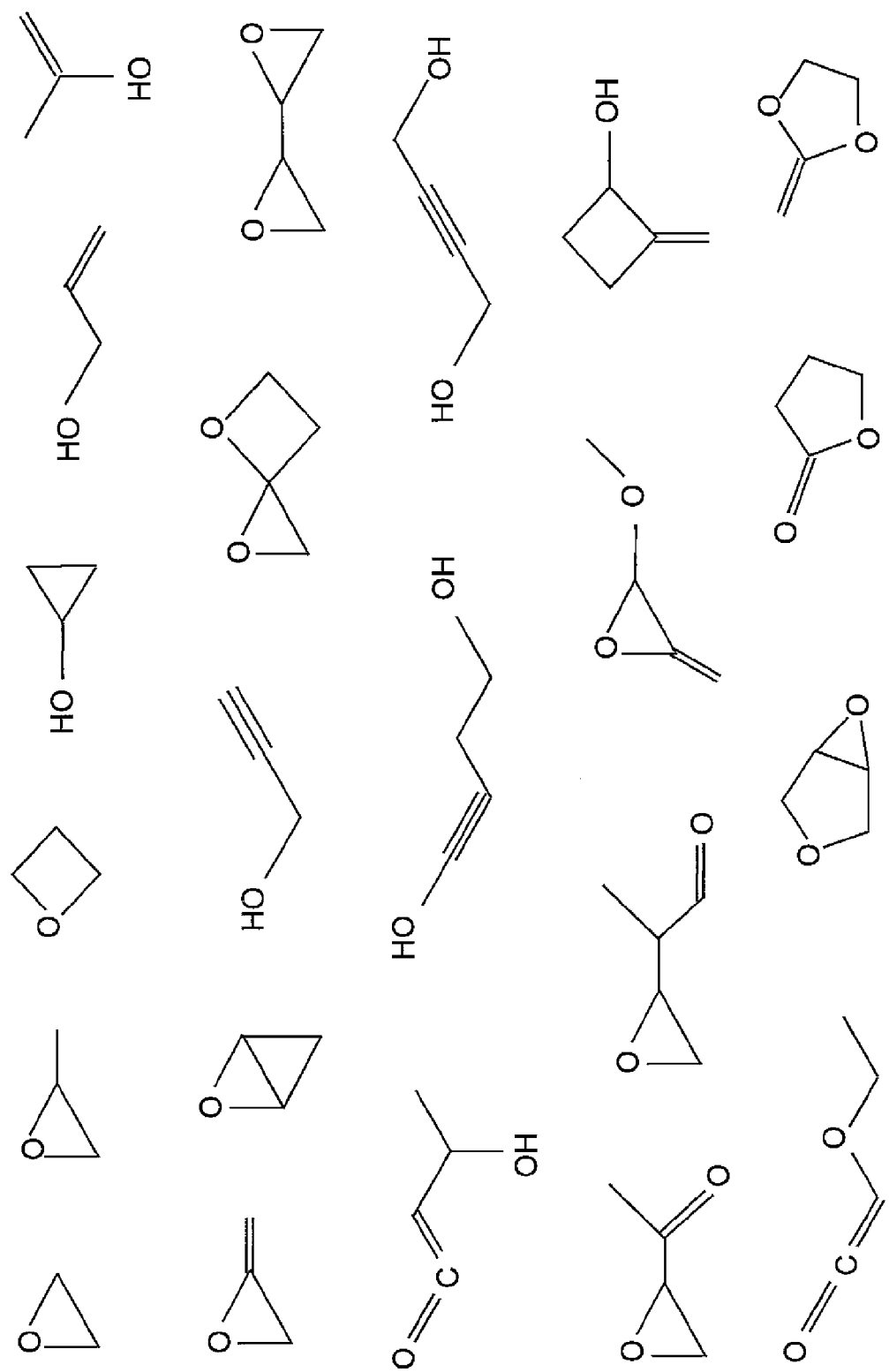
FIG.10 EXAMPLES OF ORGANIC COMPOUNDS HAVING BONDS C-C-O ($C_2H_4O$, $C_3H_6O$, $C_3H_4O$, $C_4H_6O_2$)

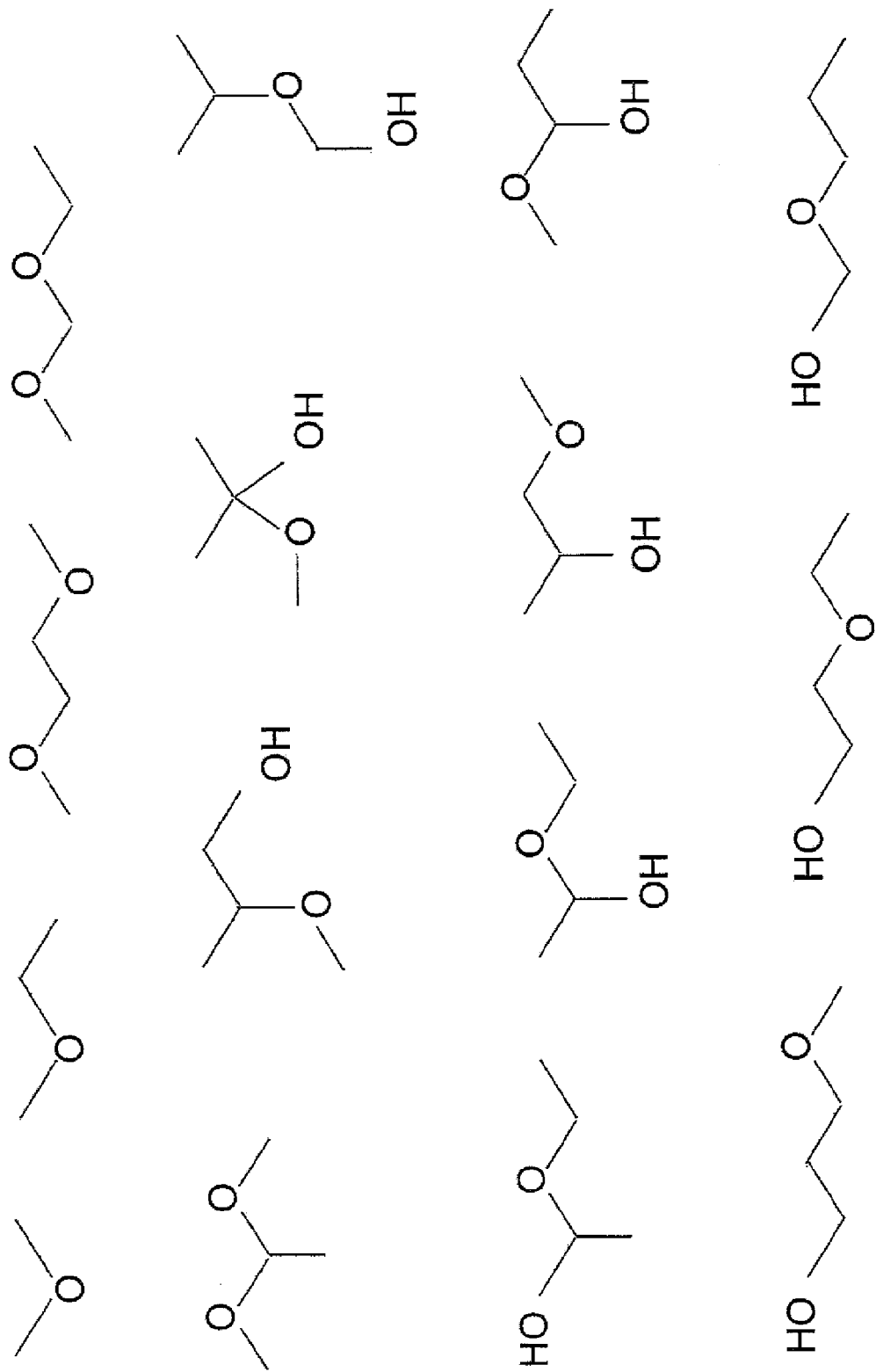
FIG.11 EXAMPLES OF ORGANIC COMPOUNDS HAVING BONDS C-O-C ($C_2H_6O$, $C_3H_8O$, $C_4H_{10}O_2$)

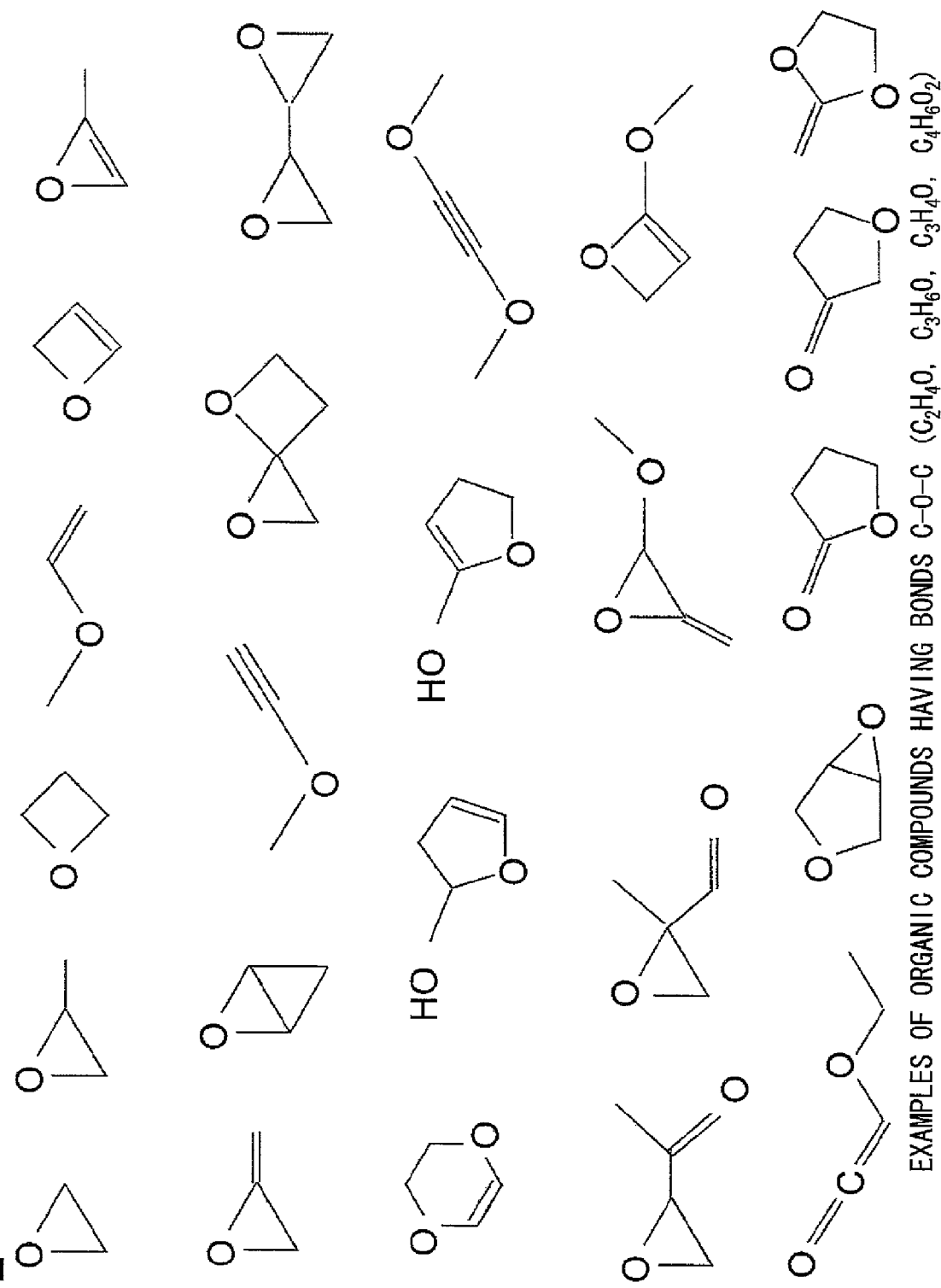
FIG.12 EXAMPLES OF ORGANIC COMPOUNDS HAVING BONDS C-O-C ($C_2H_4O$, $C_3H_6O$, $C_3H_4O$, $C_4H_6O_2$)

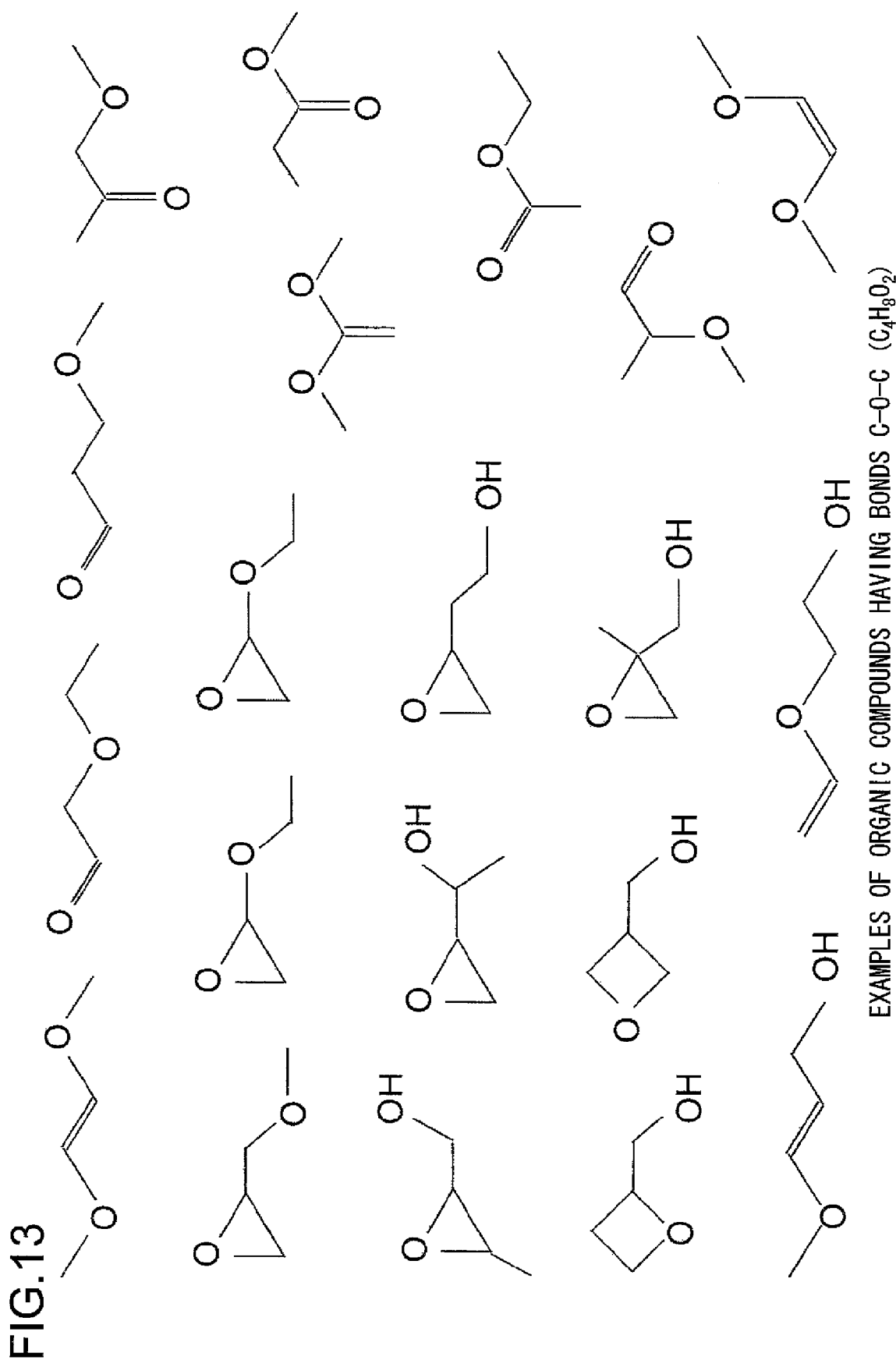
FIG.13 EXAMPLES OF ORGANIC COMPOUNDS HAVING BONDS C-O-C ($C_4H_8O_2$)

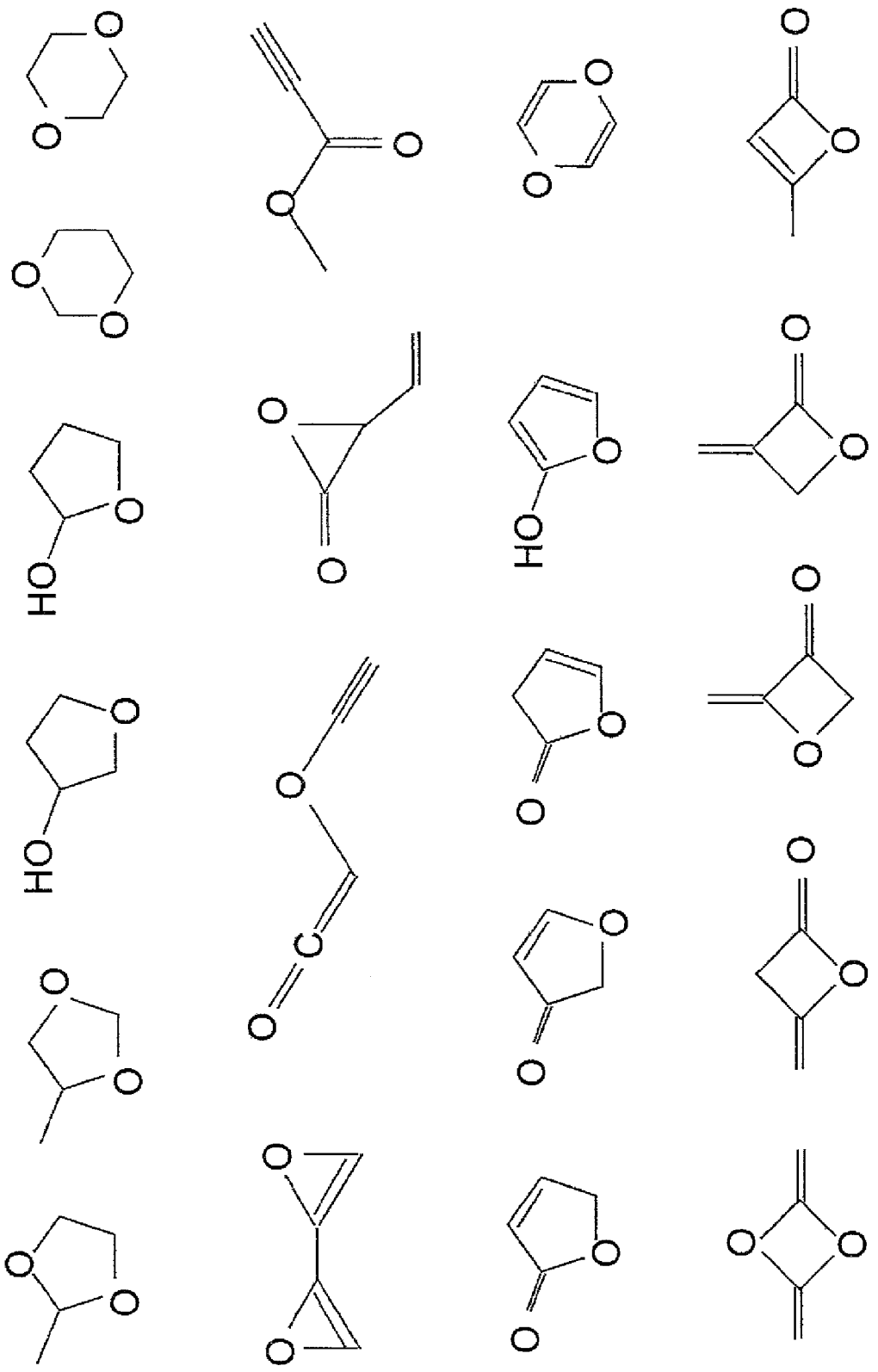
FIG.14 EXAMPLES OF ORGANIC COMPOUNDS HAVING BONDS C-O-C ($C_4H_8O_2$, $C_4H_2O_2$, $C_4H_4O_2$)

METHOD OF PRODUCING A NITRIDE SEMICONDUCTOR CRYSTAL WITH PRECURSOR CONTAINING CARBON AND OXYGEN, AND NITRIDE SEMICONDUCTOR CRYSTAL AND SEMICONDUCTOR DEVICE MADE BY THE METHOD

This application is based on Japanese Patent Application No. 2012-257430 filed on Nov. 26, 2012 and Japanese Patent Application No. 2013-15159 filed on Jan. 30, 2013, the contents of both of which are hereby incorporated by reference.

BACKGROUND OF THE INVENTION

1. Field of the Invention

The present invention relates to a method of producing a nitride semiconductor crystal by a metal organic chemical vapor deposition process, a nitride semiconductor crystal produced by such a method, and a semiconductor device provided with such a nitride semiconductor crystal.

2. Description of Related Art

Nitride semiconductor materials composed of nitrides of group III elements (such as B, Al, Ga, and In) find applications in electronic devices, such as light receiving and emitting devices (LEDs, semiconductor lasers, photodiodes, superluminescent diodes, phototransistors, solar cells, etc.), electronic devices other than light receiving and emitting devices (diodes, transistors, bipolar electronic devices, unipolar electronic devices, integrated devices, etc.), spintronics devices, photocatalyst devices, and electron tubes, and in functional materials, such as semiconductor substrates, laser media, magnetic semiconductors, phosphors (luminescent, i.e. phosphorescent and fluorescent, materials). Producing such devices and functional materials requires growing a nitride semiconductor crystal while controlling its electrical conductivity and chemical composition.

Inconveniently, however, with nitride semiconductor materials, p-type conductivity still cannot be controlled sufficiently, and carrier concentration cannot be increased sufficiently. Ordinarily, the p-type conductivity of a nitride semiconductor is controlled by use of Mg as an acceptor dopant. However, an attempt to raise carrier concentration, for example, to the order of $10^{18}/cm^3$ (atoms per cubic centimeter) ends in an acceptor dopant activation rate of the order of several percent, and it is difficult to raise carrier concentration further.

One solution to this problem is the simultaneous doping technology disclosed in Japanese Patent Application Publication No. H10-101496 (hereinafter Patent Document 1). Patent Document 1 discloses a technology of growing a GaN crystal by use of atomic $N^+$ gas obtained by irradiating a $N_2$ gas source as a source material of nitrogen with electromagnetic waves, wherein doping with Si or O as a donor dopant and doping with Mg or Be as an acceptor dopant proceed simultaneously.

In the technology disclosed in Patent Document 1, dopant source materials are supplied, in the form of an atomic beam, onto a substrate so as to be eventually introduced into a GaN crystal. Here, doping with an acceptor dopant and doping with an donor dopant proceed simultaneously with the atomic ratio of the former to the latter at 2:1. A p-type acceptor (for example, $Mg^+_{Ga}$) and an n-type donor (for example, $Si^-_{Ga}$) introduced into the GaN substrate are charged positively and negatively respectively, and by making a pair, come to have a stable electrostatic energy. Adding another acceptor atom to the pair enables it to act as an acceptor effectively. This helps achieve high-concentration doping, and helps obtain a high carrier concentration, resulting in efficient activation as an acceptor.

In ordinary p-type doping, where the p-type conductivity of a nitride semiconductor is controlled by use of Mg as an acceptor dopant, as mentioned above, it is difficult to raise carrier concentration. Moreover, the dopant level is typically so deep as to exceed 100 meV, and this inconveniently results in a low activation rate at room temperature and large temperature dependence in resistivity and carrier concentration.

The technology disclosed in Patent Document 1 mentioned above is not for crystal growth by an ordinary MOCVD (metal organic chemical vapor deposition) process using a hydride such as ammonia as a source material of nitrogen. This crystal growth method using a hydride such as ammonia as a group V source material gas is superior to other technique in overall terms from the viewpoints of crystal quality, controllability, reproducibility, and productivity, and is therefore applied to mass production of various devices. However, Patent Document 1 does not disclose a technology for simultaneous doping that is effective in such a growth technique.

Even if the simultaneous doping of which the principle is proposed in Patent Document 1 is applied to an MOCVD crystal growth process, it is still difficult to obtain a high carrier concentration and a high activation rate stably. It is also difficult to produce a p-type semiconductor crystal at a shallow dopant level stably.

In a nitride semiconductor crystal, the atomic density of a group III element or a group V element is around the middle of the order of $10^{22}/cm^3$, and this number is the number of acceptor sites that an acceptor atom can take. On the other hand, the range within which acceptor concentration needs to be controlled in a p-type layer in a semiconductor device is about $10^{17}/cm^3$ to $10^{20}/cm^3$, and thus acceptor atoms are distributed in the crystal in a state sparsely substituting acceptor sites, with one acceptor atom for several hundred acceptor sites at most and, in an ordinarily used range up to the middle of the order of $10^{22}/cm^3$, with one or less acceptor atom for 10000 acceptor sites.

The crux of the principle disclosed in Patent Document 1 is that two acceptor atoms and one donor atom interact with one another in the crystal to stabilize. Accordingly, they need to be disposed in neighboring sites in the crystal. However, in an ordinary MOCVD crystal growth process using a hydride gas as a source material of nitrogen, even when an acceptor source material (in the case of Mg, i.e. the same dopant species as in Patent Document 1, its source material gas is that of an organic metal compound of Mg) and a donor source material (in the case of Si, i.e. the same dopant species as in Patent Document 1, its source material gas is a hydride of Si) are introduced into a growth machine with such control that they are introduced into the crystal in a predetermined atomic ratio, since acceptor atoms (or donor atoms) are distributed extremely sparsely as mentioned above, they are not conveniently introduced in such a way that two acceptor atoms and one donor atom are disposed at neighboring sites.

Acceptor atoms and donor atoms tend to be introduced in a dispersed fashion in the crystal, and thus the principle of stabilization proposed in Patent Document 1 is very unlikely to take effect. Thus, the technology is far from enabling efficient doping. Incidentally, no particular attention is paid to this problem, either, in the technology disclosed in Patent Document 1 of growing a GaN crystal by use of atomic $N^+$ gas obtained by irradiating a $N_2$ gas source as a source material of nitrogen with electromagnetic waves. Thus, the technology is supposed to suffer from a similar problem.

SUMMARY OF THE INVENTION

An object of the present invention is to provide a method of producing a p-type nitride semiconductor crystal by a metal organic chemical vapor deposition process with good controllability.

To achieve the above object, according to one aspect of the present invention, a method of producing a nitride semiconductor crystal includes a step of obtaining p-type conductivity by introducing C (carbon) and O (oxygen) atoms simultaneously into the crystal by a metal organic chemical vapor deposition process using as source materials an organic metal compound of a group III element, a hydride of nitrogen, and an organic compound having any of the partial structures C—C—O, C—C=O, C=C—O, C=C=O, and C≡C—O.

To achieve the above object, according to another aspect of the present invention, a method of producing a nitride semiconductor crystal includes a step of obtaining p-type conductivity by introducing C and O atoms simultaneously into the crystal by a metal organic chemical vapor deposition process using as source materials an organic metal compound of a group III element, a hydride of nitrogen, and an organic compound having the partial structure C—O—C.

According to the present invention, both C and O atoms in an organic compound source material for producing a p-type semiconductor crystal are more reliably introduced into N (nitrogen) atom sites where they are to act as an acceptor and a donor respectively. Thus, it is possible to provide a method of producing a p-type nitride semiconductor crystal by a metal organic chemical vapor deposition process with good controllability.

BRIEF DESCRIPTION OF THE DRAWINGS

FIG. 8 is a diagram showing organic compounds having the partial structure C—C—O;

FIG. 9 is a diagram showing organic compounds having the partial structure C—C—O;

FIG. 10 is a diagram showing organic compounds having the partial structure C—C—O;

FIG. 11 is a diagram showing organic compounds having the partial structure C—O—C;

FIG. 12 is a diagram showing organic compounds having the partial structure C—O—C;

FIG. 13 is a diagram showing organic compounds having the partial structure C—O—C; and FIG. 14 is a diagram showing organic compounds having the partial structure C—O—C.

DETAILED DESCRIPTION OF PREFERRED EMBODIMENTS

Hereinafter, embodiments of the present invention will be described with reference to the accompanying drawings. It should be noted that all diagrams showing a wafer are schematic diagrams that are merely meant to show concepts and accordingly the dimensions there, such as lengths, widths, and thicknesses, are modified as necessary for simplicity's sake and do not reflect the actual relationships among them; in particular, thicknesses are exaggerated as necessary in relative terms. Among different diagrams, identical or equivalent parts are identified by common reference signs.

In all embodiments, crystal growth is performed on an MOCVD machine. An MOCVD machine is provided with a mechanism for heating a substrate placed inside a furnace, a mechanism for introducing gases into the furnace, and a mechanism for exhausting gases out of the furnace. In all embodiments, nitride semiconductors are grown by an MOCVD growth process using, as gases introduced into the furnace, an organic metal compound of a group III element as a source material of a group III element and a hydride of nitrogen, such as ammonia or hydrazine, as a source material of a group V element. Moreover, as a source material for producing a p-type semiconductor crystal, an organic compound having a partial structure C*C*O (where * represents a single bond or a multiple bond) is used. Specifically, C*C*O may be any of C—C—O, C—C=O, C=C—O, C=C=O, and C≡C—O. Instead, as a source material for producing a p-type semiconductor crystal, an organic compound having the partial structure C—O—C may be used. Also used as gases introduced into the furnace as necessary are a carrier gas (typically hydrogen or nitrogen) and a gas containing a dopant source material for producing an n-type semiconductor crystal.

First Embodiment

Figure 1:
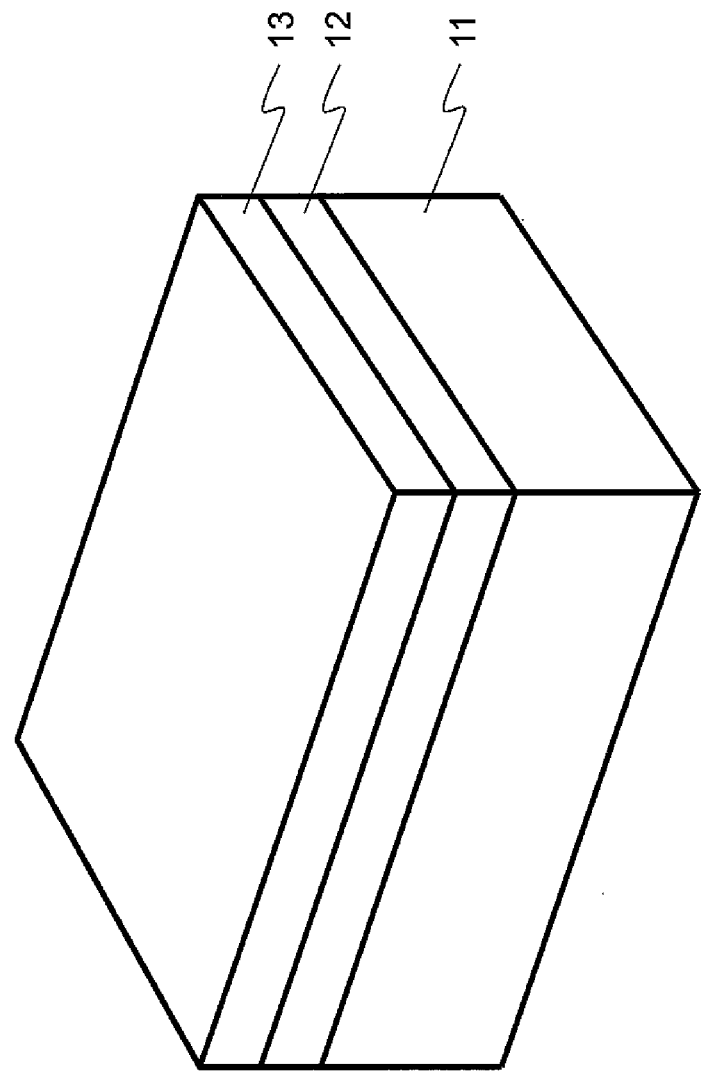
FIG. 1 is a perspective view of a substrate on which a nitride semiconductor layer according to a first embodiment of the invention is formed.

FIG. 1 is a perspective view of a substrate on which nitride semiconductor layers according to a first embodiment are formed. On a substrate 11, a nitride semiconductor layer 12 and a p-type nitride semiconductor layer 13 are formed in this order. The substrate 11 may be a plain substrate of a single substance such as sapphire, ruby, gallium oxide, a nitride semiconductor (such as GaN, AlN, or AlGaN), SiC, $ZrB_2$, or Si, or may be a plain substrate of a single substance or a plain substrate composed of a plurality of substances having a film of another substance formed on it as necessary; that is, any of such substrates may be used as are used for crystal growth of nitride semiconductors. The surface of the substrate 11 may have irregularities, or may have a film formation material in the form of a mask; in such cases the surface of the substrate 11 may not be homogenous or flat.

Figure 2:
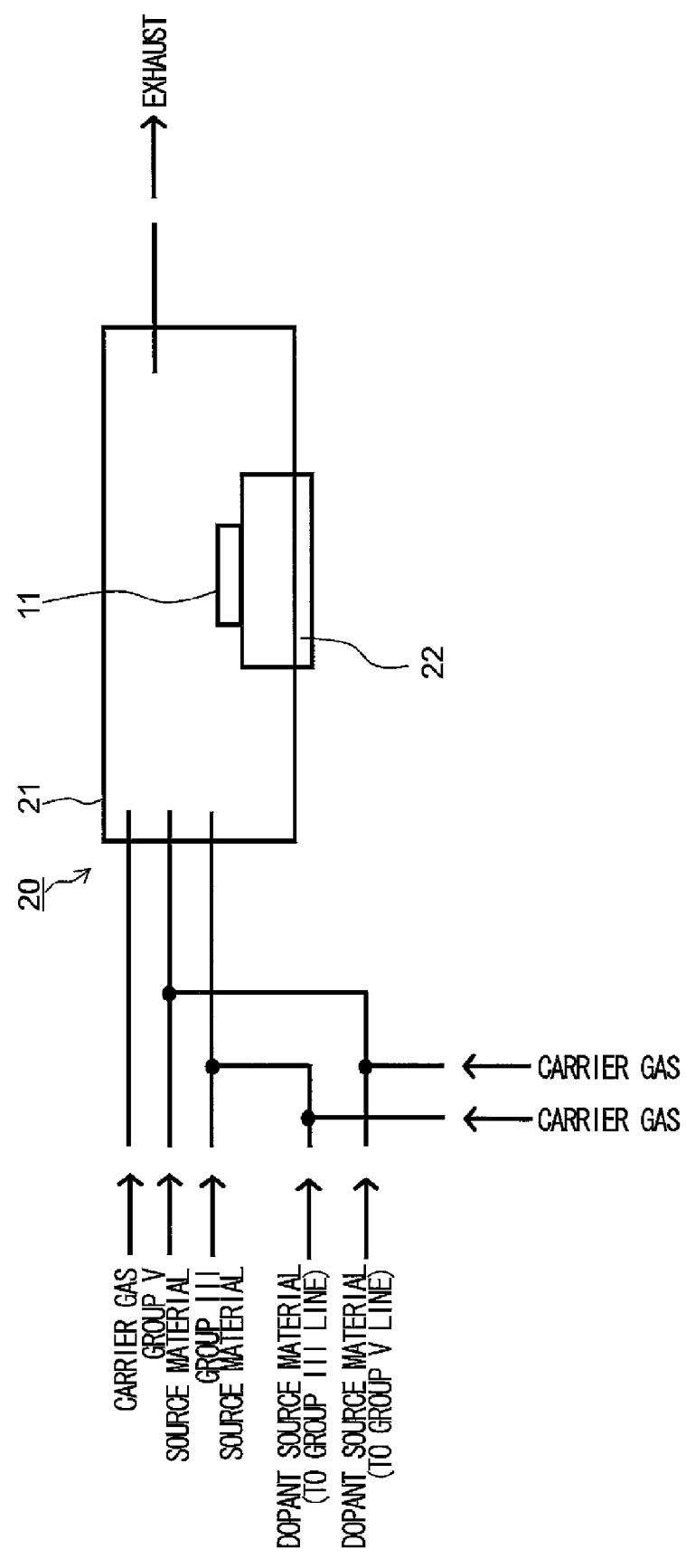
FIG. 2 is a schematic diagram of an MOCVD machine used in the first embodiment.

Next, a description will be given of a process for forming the nitride semiconductor layer 12 and the p-type nitride semiconductor layer 13. FIG. 2 is a schematic diagram of a MOCVD machine used in the first embodiment. The MOCVD machine 20 is provided with a furnace 21, a stage 22 provided inside the furnace 21 and equipped with a substrate heating mechanism, and a plurality of pipes for supplying source materials to the furnace 21.

First, the substrate 11 is placed on the stage 22, the substrate 11 is then heated to a predetermined temperature adequate to grow the nitride semiconductor layer 12, and the temperature is maintained. Subsequently, using a carrier gas containing hydrogen, a source material of a group III element and ammonia gas as a source material of nitrogen are supplied, so that the nitride semiconductor layer 12 is formed on the substrate 11.

The nitride semiconductor layer 12 serves as a primer layer for subsequent formation of the p-type nitride semiconductor layer 13, and helps obtain better crystallinity than when the p-type nitride semiconductor layer 13 is formed directly on the substrate. The nitride semiconductor layer 12 thus contributes to control of conductivity.

Subsequently, while the temperature of the substrate 11 is maintained at a predetermined temperature in the range of 900° C. to 1100° C. adequate for formation of the p-type nitride semiconductor layer 13, using a carrier gas containing hydrogen, trimethylgallium (TMG) as a source material of a group III element, ammonia gas as a source material of nitrogen, and acetaldehyde ($CH_3$—CH=O) as a source material for producing a p-type semiconductor crystal are supplied, so that the p-type nitride semiconductor layer 13 of GaN is formed on the nitride semiconductor layer 12.

Here, acetaldehyde is an organic compound having the partial structure C—C=O. Into the produced p-type GaN crystal, $3 \times 10^{18}/cm^3$ (atoms per cubic centimeter) of O and $6 \times 10^{18}/cm^3$ of C were introduced. Measured at room temperature, the carrier concentration was about $2 \times 10^{18}/cm^3$. Thus, considering that the activation rate of Mg acceptors, which are ordinarily used in doping of GaN with a p-type dopant, is of the order of several percent, a remarkably high activation rate was obtained.

Evaluated through measurement of the temperature dependence of the carrier concentration, the activation energy of the acceptor level was 10 meV to 70 meV, with fluctuations and errors taken into account. Thus, considering that the activation energy of Mg acceptors, which are ordinarily used in doping of GaN with a p-type dopant, exceeds 100 meV, a remarkably shallow acceptor level was obtained.

Using a nitride semiconductor having excellent p-type properties as described above in a p-type layer in a device, for example, in a p-type layer in an LED, reduces the driving voltage and facilitates carrier injection into the active layer, leading to improved properties such as increased light emission efficiency. Moreover, the shallow acceptor level reduces temperature dependence in the properties of the p-type layer, making it possible to produce a device having excellent properties with small temperature dependence in driving voltage and in light emission efficiency. Excellent p-type properties as described above are advantageous not only in LEDs but also in any other devices mentioned earlier.

Figure 3:
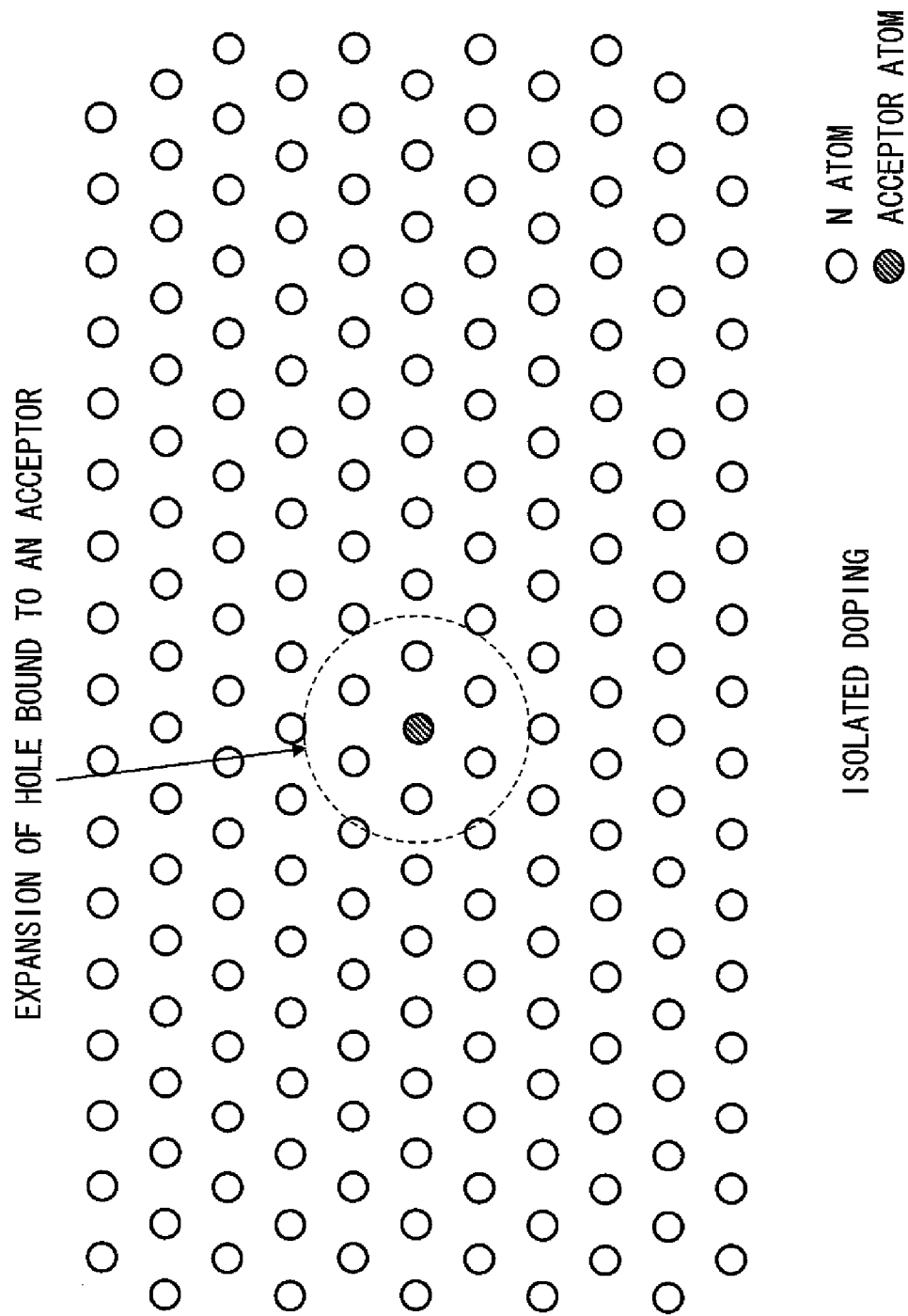
FIG. 3 is a schematic diagram of a p-type nitride semiconductor crystal produced by a conventional doping method.
Figure 4:
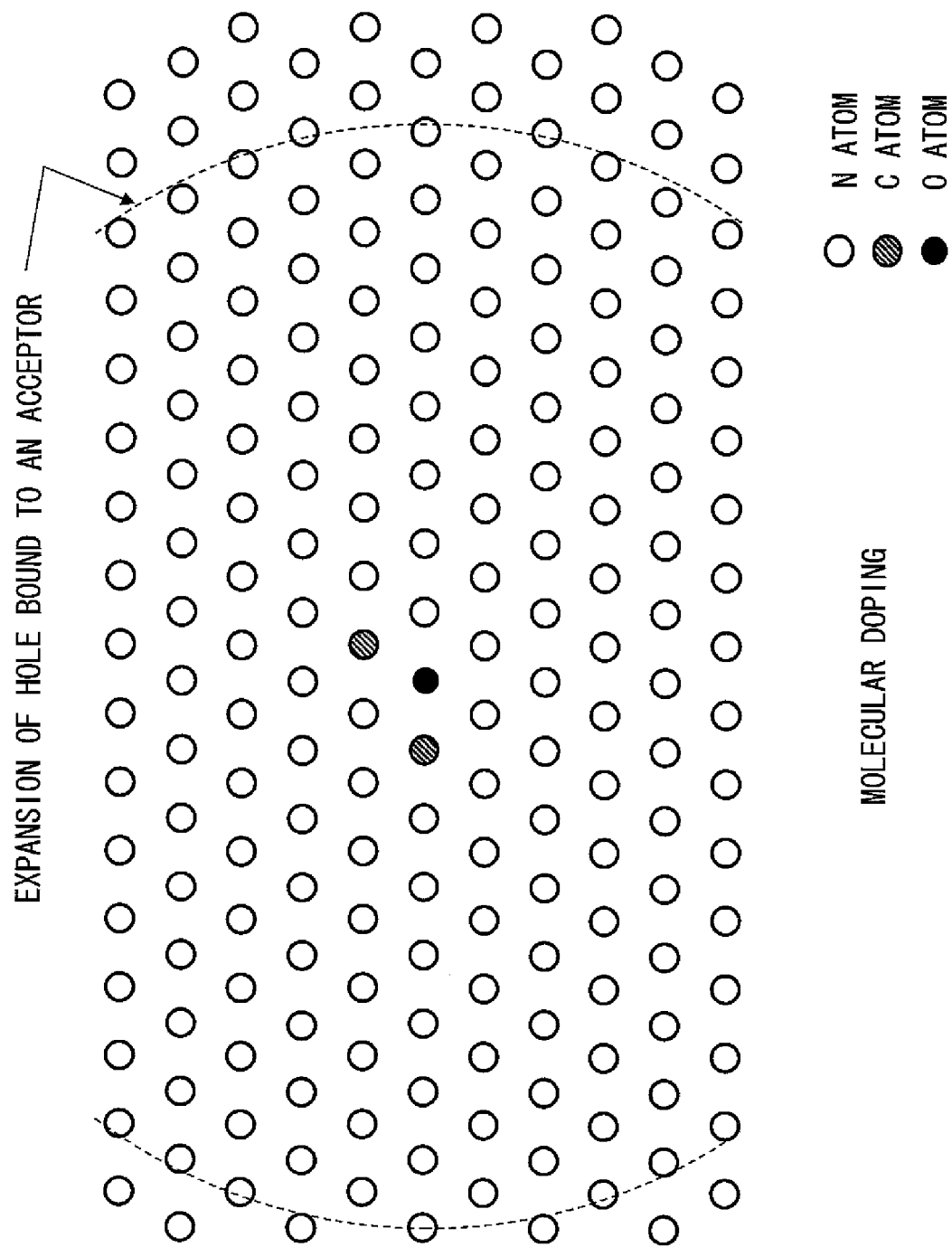
FIG. 4 is a schematic diagram of a p-type nitride semiconductor crystal produced by a doping method according to the first embodiment.

FIG. 3 is a schematic diagram of a p-type nitride semiconductor crystal produced by a conventional doping method, and FIG. 4 is a schematic diagram of a p-type nitride semiconductor crystal produced by a doping method according to first embodiment. Each diagram only shows the sites of group V atoms in the nitride semiconductor crystal.

A C (carbon) atom can substitute for an N (nitrogen) atom in the nitride semiconductor crystal to cause deficiency of an electron, becoming an acceptor. An O (oxygen) atom can substitute for an N atom in the nitride semiconductor crystal to cause excess of an electron, becoming a donor. As shown in FIG. 3, in conventional doping, an acceptor atom (for example, a C atom) is introduced in isolation (isolated doping). If source material gases for acceptors and donors are introduced with no special care taken so that acceptors and donors are introduced simultaneously, since acceptor atoms and donor atoms exist sparsely, these are highly likely to exist in isolation as in FIG. 3.

By contrast, in the growth process according to the first embodiment, as a source material for growing a p-type semiconductor crystal, an organic compound having the bonds C—C=O is used, and thus when it is introduced into the crystal, as shown in FIG. 4, C and O atoms are, as they are, introduced into neighboring sites and hence in such a way that the two acceptor atoms and one donor atom, each electrically charged, interact with one another inside the crystal.

In the present specification, doping that proceeds as described just above is referred to as molecular doping. This term is meant to refer only conceptually to a state in which a plurality of acceptor/donor atoms interact with one another, and should be considered not a physically precise term but one used for convenience' sake.

As discussed above, with the technique according to this embodiment, the phenomenon of two acceptor atoms and one donor atom being introduced into neighboring sites, that is, molecular doping, takes place reliably. This permits the mechanism disclosed in Japanese Patent Application Publication No. 10-101496 (Patent Document 1) to be activated extremely efficiently in a crystal. That is, the two acceptor atoms and one donor atom introduced into neighboring sites cause, as a molecule as a whole, deficiency of a total of one electron, becoming an acceptor. Here, owing to the mechanism disclosed in Patent Document 1, the energy of the hole bound to the acceptor is low, and thus a shallow acceptor having a low activation energy is obtained. As a result, it is possible to achieve high-concentration doping and a high carrier concentration with good reproducibility and stability as well as efficient activation of acceptors.

In this embodiment, using acetaldehyde, which is an organic compound containing two C atoms and one O atom, is particularly suitable to permit a set of two C atoms and one O atom to be introduced into neighboring sites.

Using AlGaN (with an Al content of 1% to 100%) as the p-type nitride semiconductor layer 13 resulted in as excellent control of the p-type as described above, better than conventionally possible. In that case, as a source material of a group III element, depending on the Al content, in addition to TMG, trimethylaluminum (TMA) was used. In a nitride semiconductor with a particularly high Al content, it is conventionally difficult to produce a low-resistance p-type, and therefore the present technology provides a great advantage.

Using GaInN (with an In content of 1% to 100%) as the p-type nitride semiconductor layer 13 resulted in as excellent control of the p-type as described above, better than conventionally possible. In that case, as a source material of a group III element, depending on the In content, in addition to TMG, trimethylindium (TMI) was used.

Using AlInN (with an In content of 1% to 99%) as the p-type nitride semiconductor layer 13 resulted in as excellent control of the p-type as described above, better than conventionally possible. Based on these results, as the p-type nitride semiconductor layer 13, the compound AlGaInN of any composition is expected to provide as excellent control of the p-type.

Figure 5:
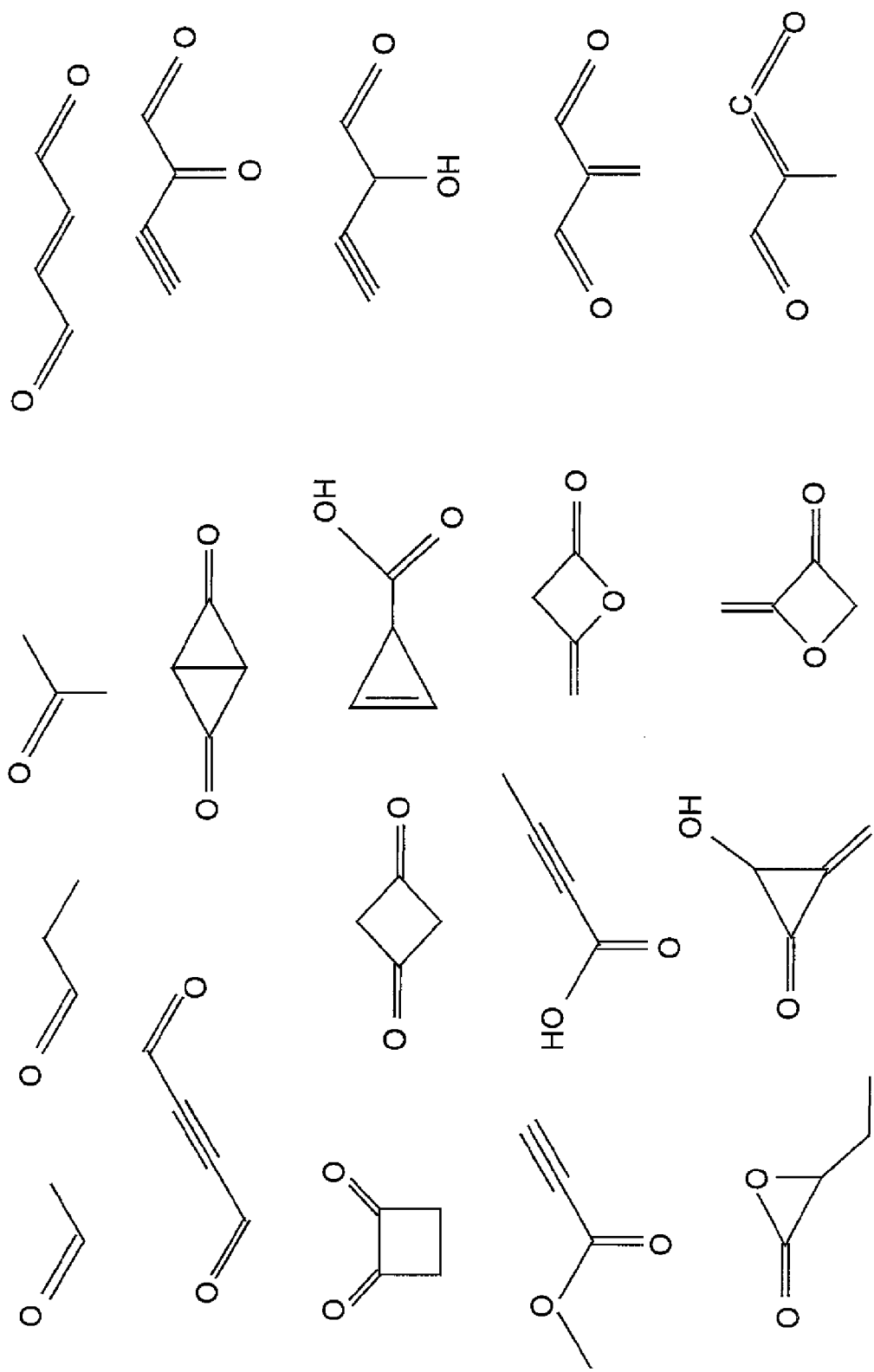
FIG. 5 is a diagram showing organic compounds having the partial structure C—C=O.

Although in this embodiment, acetaldehyde is used as an organic compound having the bonds C—C=O for producing a p-type semiconductor crystal, any of other organic compounds having the partial structure C—C=O as shown in FIG. 5 may instead be used.

As discussed above, an organic compound source material having a partial structure C*C*O for producing a p-type semiconductor crystal is used not only as a source material for introduction of a C atom as an acceptor but as a source material for allowing C and O atoms to be introduced simultaneously and into neighboring sites in the crystal. Some conditions for crystal growth preferable to realize such introduction will be described below.

It is preferable that an organic compound source material for producing a p-type semiconductor crystal be supplied into the furnace 21 after being diluted with a carrier gas. This is because if the organic compound source material is supplied in a high concentration, before it reaches the substrate 11, reaction within itself prevents proper doping from taking place.

An organic compound source material is supplied in the following manner. In the case of an organic compound source material that is in a vapor phase, or can be supplied in a vapor phase, at a predetermined temperature, it is contained in a gas cylinder; during growth, a necessary quantity of it is supplied so that, after being diluted with a carrier gas, it is introduced into the furnace 21. In the case of an organic compound source material in a liquid phase at a predetermined temperature, it is contained in a cylinder and kept at a constant temperature; during growth, the liquid is bubbled with the carrier gas to extract the vaporized source material into the carrier gas inside the cylinder, and the source material is, after being diluted with the carrier gas as necessary, introduced into the furnace 21. In the case of an organic compound source material in a solid phase at a predetermined temperature, it is contained in a cylinder and kept at a constant temperature; during growth, a carrier gas is supplied into the cylinder to extract the sublimed source material into the carrier gas inside the cylinder, and the source material is, after being diluted with the carrier gas as necessary, introduced into the furnace 21.

It is preferable that the surface on which a p-type nitride semiconductor is grown have a predetermined off-angle relative to a principal plane of the nitride semiconductor. This is because there is a state of the surface atomic step that is suitable to introduce into a crystal both C and O atoms simultaneously by supplying an organic compound source material for producing a p-type semiconductor crystal in this embodiment. In a case where the crystal growth surface is a (0001) plane, it is preferable to use a surface that has an off-angle in the range of 0.05° to 0.8° in an arbitrary direction from the (0001) plane. Any other crystal growth surface may instead be used.

Next, a specific example of production conditions in the first embodiment will be described with reference to FIG. 2. Here, it is assumed that an organic compound source material is supplied into the furnace 21 after being sufficiently diluted with a carrier gas. In FIG. 2, to simplify illustration, of all the supply-side pipes, only those belonging to the circuit for supplying source materials and other gases into the furnace 21 are shown; in practice, there are also provided, among others, a line connected via a switch value for direct exhaustion to outside the machine for quick switching of the supply of gases into the furnace 21, a line for purging the piping, and a line for securing safety, along with appropriate valves and flow controllers, though these are omitted from illustration.

First, a gas cylinder filled with acetaldehyde diluted to 1% with nitrogen is prepared. This gas cylinder is connected to a dopant source material circuit that is connected to a group V line. During formation of the p-type nitride semiconductor layer 13, a source material gas is supplied from the cylinder, and is immediately diluted with a carrier gas which is nitrogen; then the dopant source material (acetaldehyde) according to the embodiment is supplied via the group V source material line into the furnace 21.

It is preferable that the diluted gas contain 0.01 ppm to 10000 ppm of acetaldehyde. Further preferably, the dilution rate is 1 ppm to 1000 ppm. This helps prevent reaction within the gas, and helps achieve doping and its control satisfactorily. The dilution rate can be defined as a mole ratio of acetaldehyde to the carrier gas. The gas is further diluted after being fed into the group V source material line, because a group V source material, for example ammonia, is introduced into the group V line. The dilution rate here is 1/10000 to 1/2, preferably in the range of 1/1000 to 1/2.

During formation of the p-type nitride semiconductor layer 13, it is preferable that the supply quantity of acetaldehyde be $1/10^7$ or more but $1/10^2$ or less in mole ratio of the supply quantity of the group III source material. This makes proper doping possible. A further preferable range is 1/100000 or more but 1/1000 or less. This permits the p-payer carrier concentration to be controlled in a range suitable in an element constituting an electronic device, namely about $10^{17}/cm^3$ to $10^{20}/cm^3$.

As a gas for diluting the dopant source material, instead of nitrogen taken up above, any gas that is commonly used as a carrier gas may be used, such as an inert gas, like helium or argon, or hydrogen.

Second Embodiment

In a second embodiment, a technique is adopted in which, when a p-type semiconductor crystal is grown, the supply ratio of nitrogen as a group V source material to a group III source material is varied cyclically, and synchronously the supply quantity of an organic compound source material is varied cyclically.

That is achieved in the following manner. When the p-type semiconductor crystal is grown, the supply ratio of nitrogen as a group V source material to a group III source material is varied cyclically. This is done to cause a first period, during which a group III element is preferentially deposited on the growing crystal surface, and a second period, during which group V atoms (N atoms) are preferentially deposited on the growing crystal surface, to alternate, and synchronously with the second period, the organic compound is supplied, or the supply quantity of the organic compound is increased, to grow a nitride semiconductor crystal.

In other words, the organic compound source material is supplied in a relatively small quantity during the first period, in which the group III element is supplied in a relatively large quantity, and is supplied in a relatively large quantity during the first period, in which the group V source material is supplied in a relatively large quantity.

In this way, both C and O atoms in the organic compound source material for producing the p-type semiconductor crystal are more reliably introduced into the sites of a group V atom (N atom) where they are to act as an acceptor and a donor respectively. This effectively activates the mechanism that enables good p-type controllability.

Now, with reference to the sequence shown in FIG. 6, a more specific description will be given of the method of supplying the different source materials during growth of a p-type semiconductor crystal according to this embodiment. The group III source material is supplied in a large quantity (IIImax) in the first period, and is otherwise supplied in a small quantity (IIImin); it is thus supplied cyclically and intermittently. IIImin preferably equals zero, but the supply quantity may instead be sufficiently small, for example, more than zero but one-fifth of IIImax or less.

The group V source material is supplied in a large quantity (Vmax) in the second period, which falls within the IIImin period, and is otherwise supplied in a small quantity (Vmin); it is thus supplied cyclically and intermittently. Vmin preferably equals zero, but the supply quantity may instead be more than zero but one-fifth of Vmax or less in order to suppress release of the group V element.

Figure 6:
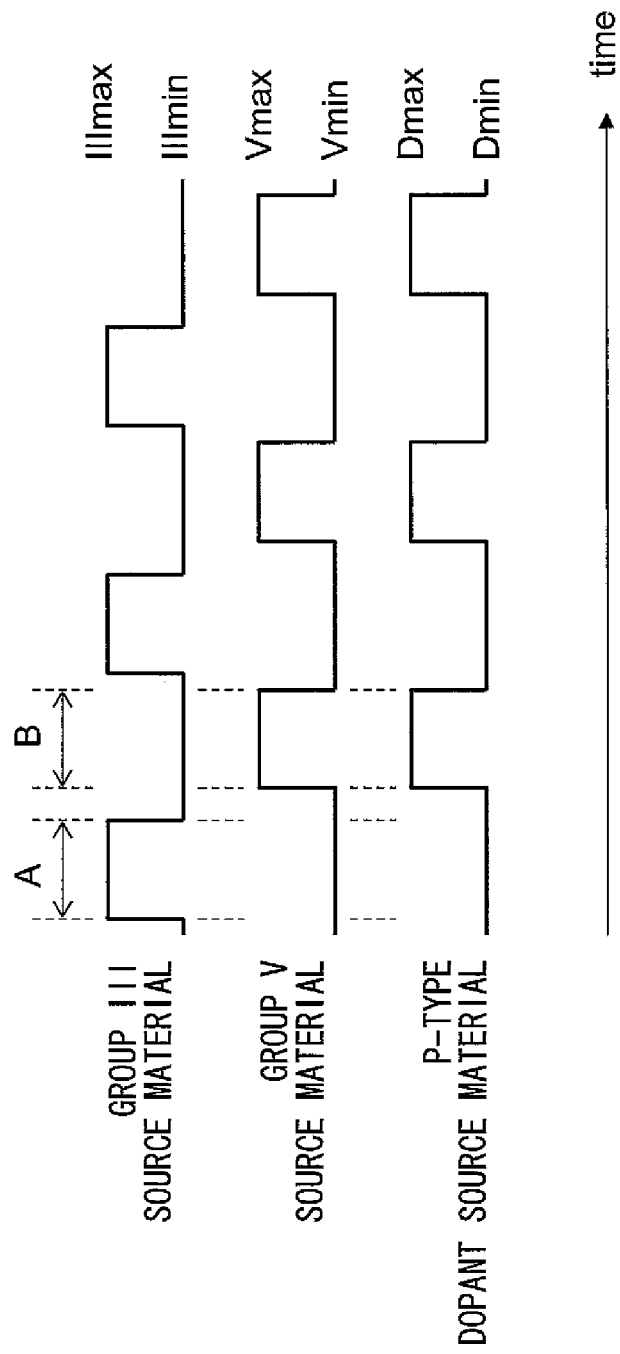
FIG. 6 is a sequence diagram showing a method of supplying different source materials during growth of a p-type semiconductor crystal according to a second embodiment of the present invention.

Here, the first and second periods are completely separated from each other, corresponding to periods A and B respectively in FIG. 6. Through the sequence described above, so-called alternate supply is achieved. Although FIG. 6 shows only a few cycles, in reality a large number of cycles are repeated.

The organic compound source material for producing the p-type semiconductor crystal is supplied in a large quantity (Dmax) synchronously (concurringly) with the second period, and is otherwise supplied in a small quantity (Dmin). Dmin preferably equals zero, but may instead be a quantity not equal to zero but significantly smaller than Dmax. Thus, in the second period, the organic compound source material for producing the p-type semiconductor crystal is supplied, and C and O atoms contained in it are introduced into group V sites.

As described above, in an organic compound source material for producing a p-type semiconductor crystal, a C atom is an acceptor atom that can substitute for a group V atom (N atom) in a nitride semiconductor crystal to cause deficiency of an electron and become an acceptor, and an O atom is a dopant atom that can substitute for a group V atom (N atom) in a nitride semiconductor crystal to cause excess of an electron and become a donor; when both are introduced into group V sites, the mechanism according to this embodiment takes effect. It is therefore preferable to manipulate so as to make it easy for those atoms to be introduced into group V sites simultaneously, and thus an organic compound source material for producing a p-type semiconductor crystal suits well with an alternate supply growth process. Thus, according to this embodiment, it is possible to effectively produce a satisfactory p-type nitride semiconductor crystal with stability and good reproducibility.

Incidentally, the sequence shown in FIG. 6 is merely an example, and is not meant to limit specific methods of implementation in any way. In this embodiment, between the first and second periods, there is provided a period during which both source materials are supplied in small quantities (or not supplied at all). This period, however, is not essential. For example, it is possible to reduce the supply of the group V source material while simultaneously increasing the supply of the group III source material, or to provide a slight overlapping period. Likewise, it is possible to reduce the supply of the group III source material while simultaneously increasing the supply of the group V source material, or to provide a slight overlapping period.

In this embodiment, the supply of the p-type dopant source material follows the increasing and decreasing of the supply of the group V source material. This is not essential, either. It is only necessary that a period in which the group V source material is supplied in a large quantity include a period in which the p-type dopant source material is supplied in a large quantity, and their supply may be increased and decreased with deviated timing. Moreover, an alternate supply process is also known in which, while a group V source material is supplied in a constant quantity, only a group III source material is supplied intermittently (in FIG. 6, Vmax=Vmin). Even in that case, if a period in which the supply ratio of the group V source material is relatively high includes a period in which the p-type dopant source material is supplied in a large quantity, the process can be considered to be a variation of this embodiment.

Third Embodiment

In a third embodiment, an organic compound is supplied with different timing than in the second embodiment. This is realized in the following manner. When a p-type semiconductor crystal is grown, the supply ratio of a hydride of nitrogen as a group V source material to a group III source material is varied cyclically. This is done to cause a first period, during which the group III element is preferentially deposited on the growing crystal surface, and a second period, during which the group V atoms (N atoms) are preferentially deposited on the growing crystal surface, to alternate, and from between a first period and the subsequent second period to before the second period, an organic compound is supplied, or the supply quantity of the organic compound is increased, to grow a nitride semiconductor crystal.

In other words, the organic compound source material is supplied in a relatively small quantity during the first period, in which the supply ratio of the group III element is relatively high, and also during the second period, in which the supply ratio of the group V source material is relatively high, and is supplied in a relatively large quantity between the first and second periods.

In this way, adequate quantities of both C and O atoms are introduced into the sites of group V atoms (N atoms) before the group V element reaches the sites. This effectively activates the mechanism that enables good p-type controllability.

With reference to the sequence shown in FIG. 7, a more specific description will be given of the method of supplying the different source materials during growth of a p-type semiconductor crystal according to this embodiment. The group III source material is supplied in a large quantity (IIImax) in the first period, and is otherwise supplied in a small quantity (IIImin); it is thus supplied cyclically and intermittently. IIImin preferably equals zero, but the supply quantity may instead be sufficiently small, for example, more than zero but one-fifth of IIImax or less.

The group V source material is supplied in a large quantity (Vmax) in the second period, which falls within the IIImin period, and is otherwise supplied in a small quantity (Vmin); it is thus supplied cyclically and intermittently. Vmin preferably equals zero, but the supply quantity may instead be more than zero but one-fifth of Vmax or less in order to suppress release of the group V element.

Figure 7:
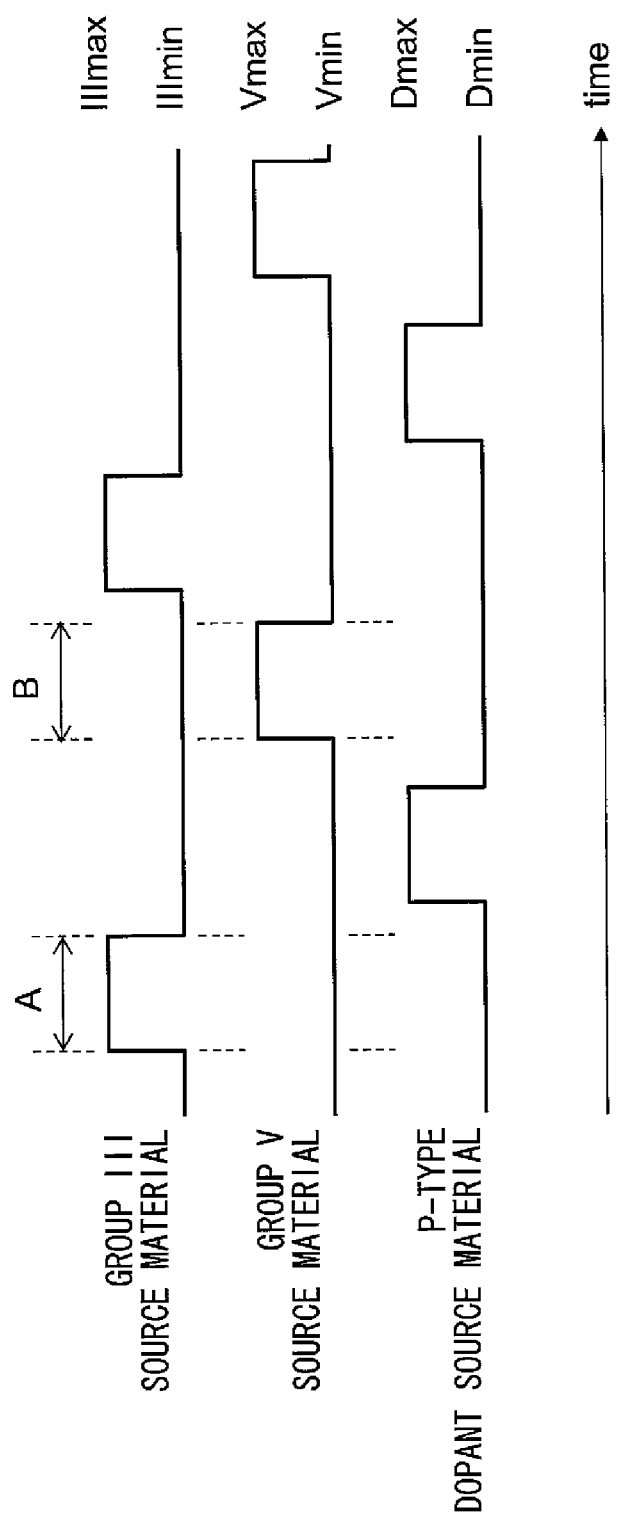
FIG. 7 is a sequence diagram showing a method of supplying different source materials during growth of a p-type semiconductor crystal according to a third embodiment of the present invention.

Here, the first and second periods are completely separated from each other, corresponding to periods A and B respectively in FIG. 7. Through the sequence described above, so-called alternate supply is achieved. Although FIG. 7 shows only a few cycles, in reality a large number of cycles are repeated.

The organic compound source material for producing the p-type semiconductor crystal is supplied in a large quantity (Dmax) between the first and second periods, and is otherwise supplied in a small quantity (Dmin). Dmin preferably equals zero, but may instead be a quantity not equal to zero but significantly smaller than Dmax. Thus, between the first and second periods, that is, prior to the period in which group V atoms are preferentially deposited on the growth surface, the organic compound source material for producing the p-type semiconductor crystal is supplied to the crystal surface to which group III atoms have sufficiently been supplied, and C and O atoms contained in the organic compound source material are introduced into group V sites. Thus, according to this embodiment, it is possible to effectively produce a satisfactory p-type nitride semiconductor crystal with stability and good reproducibility.

Incidentally, the sequence shown in FIG. 7 is merely an example, and is not meant to limit specific methods of implementation in any way. In this embodiment, between the first and second periods, there is provided a period during which both source materials are supplied in small quantities (or not supplied at all). This period, however, is not essential. For example, it is possible to reduce the supply of the group V source material while simultaneously increasing the supply of the group III source material, or to provide a slight overlapping period.

In this embodiment, the supply of the p-type dopant source material may be increased and decreased with deviated timing. In particular, its decreasing may be delayed until, or until slight later than, the decreasing of the group V source material. This is reasonable in view of the intention to promote introduction of the dopant source material into group V sites. Accordingly, the third embodiment may also be so configured that the first and second periods alternate and, from between a first period and the subsequent second period to between the second period to the subsequent first period, the organic compound is supplied, or the supply quantity of the organic compound is increased, to grow the nitride semiconductor crystal.

An alternate supply process is also known in which, while a group V source material is supplied in a constant quantity, only the group III source material is supplied intermittently (in FIG. 7, Vmax=Vmin). Even in that case, if a period in which the supply ratio of the group III source material is relatively high includes a period in which the p-type dopant source material is supplied in a large quantity, the process can be considered to be a variation of this embodiment.

Fourth Embodiment

A fourth embodiment is a modification of any of the first to third embodiments where, as the dopant source material for producing a p-type semiconductor crystal, diketene ($C_4H_4O_2$) is used. This too provided good p-type controllability. Diketene has the bonds C—C=O. It is a compound containing four C atoms and two O atoms, and has no more C or O atoms than are necessary for molecular doping. Moreover, when heated in the furnace 21, diketene decomposes into monomeric ketene ($CH_2$=C=O). In this, two C atoms have a double bond, and a C atom and an O atom have another double bond. This makes it less likely that those atoms are introduced in isolation during crystal growth. Thus, the effect of molecular doping is exerted more effectively.

Fifth Embodiment

A fifth embodiment is a modification of any of the first to third embodiments where, as the dopant source material for producing a p-type semiconductor crystal, ethanol ($CH_3$—$CH_2$—OH) is used. This too provided good p-type controllability. Ethanol is a compound containing two C atoms and one O atom, and has no more C or O atoms than are necessary for molecular doping. Thus, the effect of molecular doping is exerted more effectively.

Although, in this embodiment, ethanol is used as an organic compound having the bonds C—C—O for producing a p-type semiconductor crystal, any other organic compound having the partial structure C—C—O may instead be used, such as those shown in FIGS. 8 and 9.

Sixth Embodiment

A sixth embodiment is a modification of any of the first to third embodiments where, as the dopant source material for producing a p-type semiconductor crystal, ethylene oxide is used. This too provided good p-type controllability.

Although, in this embodiment, ethylene oxide is used as an organic compound having the partial structure C—C—O for producing a p-type semiconductor crystal, any other organic compound having the partial structure C—C—O may instead be used, such as those shown in FIG. 10.

Seventh Embodiment

A seventh embodiment is a modification of any of the first to third embodiments where, as the dopant source material for producing a p-type semiconductor crystal, 2-(vinyloxy)ethanol ($CH_2$=CH—O—$CH_2$—$CH_2$—OH) is used. This too provided good p-type controllability.

Although, in this embodiment, 2-(vinyloxy)ethanol is used as an organic compound having the partial structure C=C—O for producing a p-type semiconductor crystal, any other organic compound having the partial structure C=C—O may instead be used, such as vinyl acetate ($CH_2$=CH—O—(C=O)—$CH_3$) and oxirene.

Eighth Embodiment

An eighth embodiment is a modification of any of the first to third embodiments where, as the dopant source material for producing a p-type semiconductor crystal, ethyn-1-ol (CH≡C—OH) is used. This too provided good p-type controllability.

Although, in this embodiment, ethyn-1-ol is used as an organic compound having the bonds C≡C—O for producing a p-type semiconductor crystal, any other organic compound having the bonds C≡C—O may instead be used.

Ninth Embodiment

A ninth embodiment is a modification of any of the first to third embodiments where, as the dopant source material for producing a p-type semiconductor crystal, dimethyl ether ($CH_3$—O—$CH_3$) is used. This too provided good p-type controllability.

Dimethyl ether is a compound having the partial structure C—O—C. Into the produced p-type GaN crystal, $2\times10^{18}$/cm$^3$ of O and $4\times10^{18}$/cm$^3$ of C were introduced. Measured at room temperature, the carrier concentration as was about $1.5\times10^{18}$/cm$^3$. Thus, considering that the activation rate of Mg acceptors, which are ordinarily used in doping of GaN with a p-type dopant, is of the order of several percent, a remarkably high activation rate was obtained.

Evaluated through measurement of the temperature dependence of the carrier concentration, the activation energy of the acceptor level was 2 meV to 70 meV, with fluctuations and errors taken into account. Thus, considering that the activation energy of Mg acceptors, which are ordinarily used in doping of GaN with a p-type dopant, exceeds 100 meV, a remarkably shallow acceptor level was obtained.

Having a bond like C—O—C where an O atom is held between C atoms has a great significance in realizing efficient doping. When O and C atoms are introduced into a nitride semiconductor crystal in isolation, a C atom may become an acceptor, but an O atom is likely to become a donor. As many such donors are produced, so much of the desired p-type conductivity is compensated for. This is a serious problem with a p-type crystal production process relying on simultaneous doping, the problem arising exactly because an acceptor dopant and a donor dopant are supplied simultaneously. In this respect, a source material for producing a p-type semiconductor crystal according to the present invention has bonds in which an O atom is held between C atoms. This prevents, as much as possible, an O atom from being introduced in isolation from any C atom, and is particularly effective in realizing efficient doping.

Although, in this embodiment, dimethyl ether is used as an organic compound having the bonds C—O—C bond for producing a p-type semiconductor crystal, any other organic compound having the partial structure C—O—C may instead be used, such as those shown in FIG. 11.

As described above, an organic compound source material having the partial structure C—O—C for producing a p-type semiconductor crystal is used not only as a source material for introduction of a C atom as an acceptor but as a source material for allowing a C atom and an O atom to be introduced simultaneously and into neighboring sites in the crystal. Conditions for crystal growth preferable to realize such introduction are similar to those in the first embodiment.

Tenth Embodiment

A tenth embodiment is a modification of any of the first to third embodiments where, as the dopant source material for producing a p-type semiconductor crystal, ethylene oxide ($C_2H_4O$) is used. This too provided good p-type controllability. Ethylene oxide has the bonds C—O—C, and has cyclic bonds. The cyclic bonds consist of three atoms C, O, and C. This makes it extremely unlikely that the O atom is introduced in isolation during crystal growth, and the effect of molecular doping is exerted more effectively.

Ethylene oxide is a compound containing two C atoms and one O atom, and has no more C or O atoms than are necessary for molecular doping. Thus, the effect of molecular doping is exerted more effectively. Although, in this embodiment, ethylene oxide is used as an organic compound having the bonds C—O—C for producing a p-type semiconductor crystal, any other organic compound having the partial structure O—C—O may instead be used, such as oxirene and those shown in FIG. 12.

Eleventh Embodiment

An eleventh embodiment is a modification of any of the first to third embodiments where, as the dopant source material for producing a p-type semiconductor crystal, diepoxybutane ($C_4H_6O_2$) is used. This too provided good p-type controllability. Diepoxybutane has the bonds C—O—C, and further has two sets of cyclic bonds each consisting of three atoms C, O, and C. Moreover, diepoxybutane is a compound that contains four C atoms and two O atoms, and has no more C or O atoms than are necessary for molecular doping. Thus, the effect of molecular doping is exerted more effectively. Although, in this embodiment, diepoxybutane is used as an organic compound having the bonds C—O—C for producing a p-type semiconductor crystal, any other organic compound having the partial structure C—O—C may instead be used, such as 2-acetyloxirane.

Twelfth Embodiment

A twelfth embodiment is a modification of any of the first to third embodiments where, as the dopant source material for producing a p-type semiconductor crystal, 1,4-dioxane ($C_4H_8O_2$) is used. This too provided good p-type controllability. Although, in this embodiment, 1,4-dioxane is used as an organic compound having the bonds C—O—C for producing a p-type semiconductor crystal, any other organic compound having the partial structure C—O—C may instead be used, such as 2,3-dihydro-1,4-dioxine and those shown in FIGS. 13 and 14.

Thirteenth Embodiment

A thirteenth embodiment is a modification of any of the first to third embodiments where, as the dopant source material for producing a p-type semiconductor crystal, methyl ethyl ether ($CH_3$—O—$CH_2$—$CH_3$) is used. This too provided good p-type controllability. Although, in this embodiment, methyl ethyl ether is used as an organic compound having the bonds C—O—C for producing a p-type semiconductor crystal, any other organic compound having the partial structure C—O—C may instead be used, such as diethyl ether, methyl propyl ether, and methyl isopropyl ether.

Fourteenth Embodiment

A fourteenth embodiment is a modification of any of the first to third embodiments where, as the dopant source material for producing a p-type semiconductor crystal, 3-methoxypropanal ($C_4H_8O_2$) is used. This too provided good p-type controllability. Although, in this embodiment, 3-methoxypropanal is used as an organic compound having the bonds C—O—C for producing a p-type semiconductor crystal, any other organic compound having the partial structure C—O—C may instead be used, such as methoxyacetone and 1,2-dimethoxyethane.

Although the embodiments descried above deal with cases where specific organic compounds are used as dopant source materials for producing a p-type semiconductor crystal, any other organic compounds may be used within the spirit of the present invention.

Of organic compounds having a partial structure C*C*O, those having bonds C*C=O are preferred. This is because, when bonded to a C atom strongly with a double bond, an O atom is less likely to be introduced in isolation, whereas, when introduced in isolation, an O atom acts as a donor and cancels out the p-type conductivity.

Examples of such compounds include the following: compounds with a formula $C_nH_{2n}O$ (n>1), such as [n=2]acetaldehyde, [n=3]acetone, propionaldehyde, [n=4] butyraldehyde, isobutylaldehyde, methyl ethyl ketone; and compounds with higher carbon numbers n; compounds with a formula $C_nH_{2n-2}O$ (n>1), such as [n=2] ketene, [n=3] acrolein, cyclopropanone, methylketene, [n=4] 2-methylcyclopropanone, 2-butenal, 3-butenal, isocrotonaldehyde, ethylketene, crotonaldehyde, cyclobutanone, cyclopropanecarbaldehyde, dimethyl ketene, methacrolein, methyl vinyl ketone, and compounds with higher carbon numbers n; compounds with a formula $C_nH_{2n-4}O$ (n>2), such as [n=3] 2-cyclopropen-1-one, propiolic aldehyde, methyleneketene, [n=4] 1-cyclopropene-1-carbaldehyde, cyclopropene-3-carbaldehyde, 2,3-butadiene-1-one, 2-cyclobuten-1-one, 2-butynal, 3-butynal, 2-methyl-2-cyclopropene-1-one, 3-butyn-2-one, bicyclo[1.1.0]butane-2-one, vinylketene, and compounds with higher carbon numbers n; and compounds with a formula $C_nH_{2n-6}O$ (n>3), such as [n=4] (2-cyclopropene-1-ylidene) methanone, butatrienone, and compounds with higher carbon numbers n.

A molecule having at least one set of C—C=O bonds may contain a plurality of O atoms in a single molecule. Examples of such compounds include the following: compounds with a formula $C_nH_{2n}O_2$ (n>1), such as [n=4] 3-hydroxybutyraldehyde, 1-hydroxy-2-butanone, 3-hydroxy-2-butanone, 4-hydroxy-2-butanone, 2-hydroxy-2-methylpropanal, 2-hydroxybutanal, 2-methyl-3-hydroxypropanal, 2-methoxypropanal, 3-methoxypropanal, 4-hydroxybutanal, formic acid propyl, formic acid isopropyl ester, acetoin, aldol, butyric acid, isobutyric acid, ethoxyacetaldehyde, propionic acid methyl, methoxyacetone, ethyl acetate, and compounds with a carbon number of 2, 3, 4, or more; compounds with a formula $C_nH_{2n}O_2$ (n>1), such as [n=4] (hydroxymethyl)vinyl ketone, 1,2-butanedione, 1,3-butanedione, 1-hydroxyethylketene, 2-(hydroxymethyl)propenal, 2-acetyloxirane, 2-hydroxy-3-butenal, 2-hydroxycyclobutanone, 2-butenoic acid, 3-butenoic acid, 2-methyl-3-hydroxypropenal, 2-methyl-2-oxiranecarbaldehyde, 3-methyloxirane-2-carbaldehyde, 2-methoxyacrylaldehyde, 3,3-dimethyloxirane-2-one, 3-hydroxy-2-butenal, 2-methyl-3-hydroxypropanoic acid lactone, 3-methoxypropenal, 4-hydroxy-2-butenal, 4-hydroxy-3-buten-2-one, α-butyrolactone, β-butyrolactone, γ-butyrolactone, formic acid 1-propen-2-yl ester, formic acid allyl, methyl acrylate, 3-crotonic acid, ethylhydroxyketene, ethoxyketene, crotonic acid, cyclopropanecarboxylic acid, biacetyl, succindialdehyde, tetrahydrofuran-3-one, penitricin b, methacrylic acid, methyl(hydroxymethyl)ketene, 2-methylmalonaldehyde, vinyl acetate, and compounds with a carbon number of 2, 3, 4, or more; compounds with a formula $C_nH_{2n-4}O_2$ (n>2), such as [n=4] 2-butenedial, 1,2-cyclobutanedione, 1,3-cyclobutanedione, 1-cyclopropene-1-carboxylic acid, 2(5H)-furanone, 2,3-butadienoic acid, 2-oxocyclopropane-1α-carbaldehyde, 2-cyclopropene-1-carboxylic acid, 2-hydroxy-1-methyl-1-cyclopropene-3-one, 2-hydroxy-3-butynal, 2-butynoic acid, 2-butenedial, 2-methyleneoxetane-3-one, 2-methylenepropanedial, 3(2H)-furanone, 3-hydroxy-2-butenoic acid 1,3-lactone, 3-vinyloxiran-2-one, 3-butynoic acid, 3-methyleneoxetan-2-one, 4-hydroxy-2-butynal, formic acid 2-propynyl ester, acetylketene, diketene, squaraine, furan-2(3H)-one, propiolic acid methyl ester, penitricin d, penitricin, methylformylketene, and compounds with a carbon number of 3, 4, or more; compounds with a formula $C_nH_{2n-6}O_2$ (n>2), such as [n=4] 1,3-butadiene-1,4-dione, 2-butynedial, 3-oxa-1-pentene-4-yne-1-one, 3-cyclobutene-1,2-dione, 3-butyne-1,2-dione, bicyclo[1.1.0]butane-2,4-dione, and compounds with a carbon number of 3, 4, or more. In cases where a single molecule contains a plurality of O atoms as mentioned above, to prevent an O atom from being introduced in isolation, it is preferable that the plurality of molecules be composed of a combination of a plurality of atomic groups C*C=O and C*C*O or C—O—C. Thus, it is particularly preferable to select, from the molecules enumerated above, those which have a structure as just mentioned. From a different perspective, to prevent an O atom from being introduced in isolation, compounds having no OH bond are particularly preferred.

Compounds mentioned above are all merely examples; any organic compound including a partial structure C*C=O and having a molecular formula other than those specifically mentioned above may be used. Of organic compounds having a partial structure C*C=O, those having the partial structure C=C=O are particularly preferred irrespective of whether they contain a single or a plurality of O atoms. This is because, since two C atoms and one O atom are bonded together strongly, such a structure is effective in causing the mechanism of introducing two C atoms and one O atom into neighboring sites to take place. Accordingly, it is particularly preferable to select, from the molecules enumerated above, those which have a structure as just mentioned.

Of organic compounds having a partial structure C*C*O as source materials for producing a p-type semiconductor crystal, preferred from another perspective are those containing C and O atoms in a ratio of 2:1. This is because that is the ratio of atoms necessary to cause the mechanism according to the present invention to take place in a crystal.

Examples of such organic compounds include the following: compounds with a formula $C_{2n}H_{4m+2}O_m$ (m>0), such as [m=1]ethanol, dimethyl ether, [m=2] 1,1-butanediol, 1,2-butanediol, 1,3-butanediol, 1,4-butanediol, 2,3-butanediol, 1-methoxy-1-propanol, 1-methoxy-2-propanol, 2-methoxy-1-propanol, 2-methoxy-2-propanol, 3-methoxy-1-propanol, 1,1-dimethoxyethane, 1,2-dimethoxyethane, 1-ethoxyethanol, 2-ethoxyethanol, 2-methyl-1,1-propanediol, 2-methyl-1,2-propanediol, 2-methyl-1,3-propanediol, butyl hydroperoxide, sec-butyl hydroperoxide, tert-butyl hydroperoxide, isobutyl hydroperoxide, isopropyloxymethanol, ethoxymethoxymethane, diethyl peroxide, butane-2,2-diol, propoxymethanol, methylisopropyl peroxide, and compounds with higher carbon numbers; compounds with a formula $C_{2m}H_{4m}O_m$ (m>0), such as [m=1]acetaldehyde, ethylene oxide, vinyl alcohol, [m=2] 3,4-epoxybutan-2-ol, 1,1-dimethoxyethene, 1,2-dimethoxyethene, 3-hydroxybutyraldehyde, 1-butene-1,4-diol, 2-butene-1,1-diol, 2-butene-1,2-diol, 2-butene-1,4-diol, 3-butene-1,1-diol, 3-butene-1,2-diol, 2-methyl-3-hydroxypropanal, 3,4-epoxybutan-2-ol, 3-ethyloxirane-2-ol, 3-hydroperoxy-1-butene, oxirane-2-ethanol, 1,2-cyclobutanediol, 1,2-dioxane, 1,3-dioxane, 1,4-dioxane, 1-hydroxy-2-butanone, 3-hydroxy-2-butanone, 4-hydroxy-2-butanone, 1,2-dimethoxyethene, 1-methyl-1-propenyl hydroperoxide, 2-methyl-2-propenyl hydroperoxide, 1-methylallyl hydroperoxide, 2,4-dihydroxy-1-butene, 2-(vinyloxy)ethanol, 2-(methylperoxy)-1-propene, 2-(methoxymethyl)oxirane, 2-ethoxyoxirane, 2-hydroxy-2-methylpropanal, 2-hydroxybutanal, 4-hydroxybutanal, 2-methyl-1,3-dioxolane, 4-methyl-1,3-dioxolane, 2-methyl-1-propenyl hydroperoxide, 2-methyl-3-hydroxypropanal, 2-methyloxirane-2-methanol, 3-methyloxirane-2-methanol, 2-methylene-1,3-propanediol, 2-methoxypropanal, 3-methoxypropanal, 3,3-dimethyl-1,2-dioxetane, 3-ethyl-1,2-dioxetane, 3-ethyl-3-methyldioxirane, 3-oxetanemethanol, 3-methoxy-2-propen-1-ol, 4-methyl-1,3-dioxolane, α-methyloxirane-2-methanol, formic acid propyl, formic acid isopropyl ester, acetoin, aldol, butyric acid, isobutyric acid, ethoxyacetaldehyde, oxirane-2-ethanol, oxetane-2-methanol, cyclobutane-1,1-diol, tetrahydrofuran-2-ol, tetrahydrofuran-3-ol, propionic acid methyl, methyl(1-propenyl)peroxide, methylallyl peroxide, methoxyacetone, ethyl acetate, and compounds with higher carbon numbers; compounds with a formula $C_{2m}H_{4m-2}O_m$ (m>0), such as [m=1]ethyn-1-ol, oxirene, ketene, [m=2] 1,3-butadiene-1,4-diol, 1,3-butadiene-1,1-diol, 1,3-butadiene-1,3-diol, 1,3-butadiene-1,4-diol, 3,6-dioxabicyclo[3.1.0]hexane, 2-hydroxycyclobutane-1-one, 2-acetyloxirane, 3-methyloxirane-2-carbaldehyde, 3-butyne-1,2-diol, 3-butyne-2,2-diol, 1-butyne-1,4-diol, 2,2'-bioxirane, 2-hydroxycyclobutanone, 3-vinyl-1,2-dioxetane, 3-methyloxetane-2-one, β-butyrolactone, α-butyrolactone, γ-butyrolactone, 4-hydroxy-3-butene-2-one, (hydroxymethyl)vinyl ketone, 1,2-butanedione, 1,3-butanedione, 1,4-dioxaspiro[2.3]hexane, 1-(oxiranyl)ethanone, 1-hydroxyethylketene, 2,3-dihydro-1,4-dioxin, 2,3-dihydroxy-1,3-butadiene, 2,3-dihydro-3-hydroxyfuran, 2-(hydroxymethyl)propenal, 2-acetyloxirane, 2-hydroxy-3-butenal, 2-hydroxy-4,5-dihydrofuran, 2-hydroxycyclobutanone, 2-butyne-1,4-diol, 2-butenoic acid, 3-butenoic acid, 2-methyl-3-hydroxypropenal, 2-methyl-2-oxiranecarbaldehyde, 2-methylene-1,3-dioxolane, 2-methylene-3-methoxyoxirane, 2-methoxy-1-oxa-2-cyclobutene, 2-methoxyacrylaldehyde, 3,3-dimethyloxirane-2-one, 3,4-dihydro-1,2-dioxin, 3,6-dioxabicyclo[3.1.0]hexane, 3,6-dihydro-1,2-dioxin, 3-hydroxy-2-butenal, 3-methoxypropenal, 4h-1,3- dioxin, 4-hydroxy-2-butenal, 4-hydroxy-3-buten-2-one, 4-methylene-1,3-dioxolane, formic acid 1-propen-2-yl ester, formic acid allyl, acrylic acid methyl, isocrotonic acid, ethylhydroxyketene, ethoxyketene, crotonic acid, cyclopropanecarboxylic acid, diacetyl, diepoxybutane, dimethoxyethyne, succinic aldehyde, tetrahydrofuran-3-one, bicyclo[1.1.0]butane-1,3-diol, penitricin b, methacrylic acid, methyl(1-propynyl)peroxide, methyl(hydroxymethyl)ketene, 2-methylmalonaldehyde, vinyl acetate, and compounds with higher carbon numbers; compounds with a formula $C_{2m}H_{4m-4}O_m$ (m>1), such as [m=2] 2-butenedial, 1,2-cyclobutanedione, 1,2-dioxin, 1,4-dioxin, 1,3-cyclobutanedione, 1-cyclopropene-1-carboxylic acid, 2(5h)-furanone, 3(2h)-furanone, 2,3-butadienoic acid, 2,4-dimethylene-1,3-dioxetane, 2-oxocyclopropane-1-carbaldehyde, 2-cyclopropene-1-carboxylic acid, 2-methyl-3-hydroxy-2-cyclopropene-1-one, 2-hydroxy-3-butynal, 2-butynoic acid, 3-butynoic acid, 2-butenedial, 2-methyleneoxetane-3-one, 2-methylenepropanedial, 3-hydroxy-2-butenoic acid 1,3-lactone, 3-vinyloxiran-2-one, 3-methyleneoxetan-2-one, 4-hydroxy-2-butynal, formic acid 2-propynyl ester, acetylketene, diketene, squaraine, furan-2(3h)-one, butane-1,2,3-triene-1,4-diol, propiolic acid methyl ester, penitricin a, penitricin d, methylformylketene, and compounds with higher carbon numbers; compounds with a formula $C_{2m}H_{4m-6}O_m$ (m>1), such as [m=2] 1,2:3,4-diepoxy-1,3-butadiene, 1,3-butadiyne-1,4-diol, 1,3-butadiene-1,4-dione, 2-butynedial, 3-oxa-1-pentene-4-yne-1-one, 3-cyclobutene-1,2-dione, 3-butyne-1,2-dione, bicyclo[1.1.0]butane-2,4-dione, and compounds with higher carbon numbers; compounds with a formula $C_{2m}O_m$ (m>0), such as [m=3] 1,4,7-trioxacyclonona-2,5,8-triyne, 3,6,9-trioxatetracyclo[6.1.0.0$^{2,4}$.0$^{5,7}$]nona-1(8),2(4),5(7)-triene, and compounds with any other carbon number.

Of the compounds containing C and O atoms in a ratio of 2:1, with those having a plurality of O atoms in a single molecule, to prevent an O atom from being introduced in isolation, it is preferable that the plurality of molecules be composed of a combination of a plurality of atomic groups C*C=O and C*C*O or C—O—C. Thus, it is particularly preferable to select, from the molecules enumerated above, those which have a structure as just mentioned.

Of organic compounds having the partial structure C—O—C as dopant source materials for producing a p-type semiconductor crystal, those having cyclic bonds including that partial structure are preferred. This is because an O atom is then significantly less likely to be introduced in isolation whereas, when introduced in isolation, an O atom acts as a donor and cancels out the p-type conductivity.

Examples of such compounds include the following: compounds with a formula $C_nH_{2n}O$ (n>1), such as [n=2]ethylene oxide, [n=3] oxetane, propylene oxide [n=4] 2,2-dimethyloxirane, 2,3-dimethyloxirane, 2-ethyloxirane, 2-methyloxetane, 3-methyloxetane, tetrahydrofuran, and compounds with higher carbon numbers; compounds with a formula $C_nH_{2n-2}O$ (n>1), such as [n=2] Oxirene, [n=3] 2H-oxete, 2-oxabicyclo[1.1.0]butane, 2-methyloxirene, 2-methyleneoxirane[n=4] 2,3-ethanooxirane, 2,3-dihydrofuran, 2,5-dihydrofuran, 2-oxabicyclo[1.1.1]pentane, 2-vinyloxirane, 2-methyleneoxetane, dimethyloxirene, and compounds with higher carbon numbers; compounds with a formula $C_nH_{2n-4}O$ (n>3), such as [n=4] 1-oxaspiro[2.2]penta-4-ene, 2-ethynyloxirane, 2-vinyloxirene, 2-oxatricyclo[1.1.1.0$^{1,3}$]pentane, oxabicyclo[2.1.0]penta-2-ene, furan, and compounds with higher carbon numbers; compounds with a formula $C_nH_{2n-4}O$ (n>3), such as [n=4] 2-ethynyloxirene, and compounds with higher carbon numbers.

In at least one molecule having such cyclic bonds, the single molecule may contain a plurality of oxygen atoms. Examples of such compounds include the following: compounds with a formula $C_nH_{2n}O_2$ (n>1), such as [n=4] 1,3-dioxane, 1,4-dioxane, 2-(methoxymethyl)oxirane, 2-ethoxyoxirane, 2-methyl-1,3-dioxolane, 2-methyloxirane-2-methanol, 3-oxetanemethanol, 3-methyloxirane-2-methanol, 4-methyl-1,3-dioxolane, α-methyloxirane-2-methanol, α-methyloxirane-2-methanol, oxirane-2-ethanol, oxetane-2-methanol, tetrahydrofuran-2-ol, tetrahydrofuran-3-ol, and compounds with a carbon number of 2, 3, 4, or more; compounds with a formula $C_nH_{2n-2}O_2$ (n>1), such as [n=4] 1,4-dioxaspiro[2.3]hexane, 2,3-dihydro-1,4-dioxin, 2,3-dihydrofuran-3-ol, 2-acetyloxirane, 2-hydroxy-4,5-dihydrofuran, 2-methyl-2-oxiranecarbaldehyde, 2-methylene-1,3-dioxolane, 2-methylene-3-methoxyoxirane, 2-methoxy-1-oxa-2-cyclobutene, 3,3-dimethyloxirane-2-one, 3,6-dioxabicyclo[3.1.0]hexane, 3-methyloxirane-2-carbaldehyde, 3-methyloxetan-2-one, 4h-1,3-dioxin, 4-methylene-1,3-dioxolane, α-butyrolactone, β-butyrolactone, γ-butyrolactone, diepoxybutane, tetrahydrofuran-3-one, and compounds with a carbon number of 3, 4, or more; compounds with a formula $C_nH_{2n-4}O_2$ (n>2), such as [n=4] 1,4-dioxin, 2(5H)-furanone, 2,4-dimethylene-1,3-dioxetane, 2-methyleneoxetane-3-one, 3(2H)-furanone, 3-hydroxy-2-butenoic acid 1,3-lactone, 3-vinyloxiran-2-one, 3-methyleneoxetan-2-one, diketene, furan-2(3H)-one, furan-2-ol, and compounds with a carbon number of 3, 4, or more; compounds with a formula $C_nH_{2n-6}O_2$ (n>2), such as [n=4] 1,3-butadiene-1,4-dione, and compounds with a carbon number of 4 or more. In cases where, as mentioned above, a single molecule has a plurality of oxygen atoms, to prevent an O atom from being introduced in isolation, it is preferable that the plurality of molecules be composed of a combination of a plurality of atomic groups C—O—C and C*O*C (where * represents a single bond or a multiple bond) or C—O—C. Accordingly, it is particularly preferable to select, from the molecules enumerated above, those which have a structure as just mentioned. From a different perspective, to prevent an O atom from being introduced in isolation, compounds having no OH bond are particularly preferred.

Compounds mentioned above are all merely examples; any organic compound including a partial structure C—O—C, having cyclic bonds, and having a molecular formula other than those specifically mentioned above may be used. Of organic compounds having a partial structure C—O—C, those in which the cyclic bonds consist of three atoms C, O, and C are particularly preferred. This is because, since two C atoms and one O atom are cyclically bonded together, such a structure is effective in causing the mechanism of introducing two C atoms and one O atom into neighboring sites to take place. Accordingly, it is particularly preferable to select, from the molecules enumerated above, those which have a structure as just mentioned.

Of organic compounds having the partial structure C—O—C as source materials for producing a p-type semiconductor crystal, preferred from another perspective are those containing C and O atoms in a ratio of 2:1. This is because that is the ratio of atoms necessary to cause the mechanism according to the present invention to take place in a crystal.

Such compounds include the following: compounds with a formula $C_{2m}H_{4m+2}O_m$ (m>0), such as [m=1] dimethyl ether, [m=2] 1-methoxy-1-propanol, 1-methoxy-2-propanol, 2-methoxy-1-propanol, 2-methoxy-2-propanol, 3-methoxy-1-propanol, 1,1-dimethoxyethane, 1,2-dimethoxyethane, 1-ethoxyethanol, 2-ethoxyethanol, isopropyloxymethanol, ethoxymethoxymethane, propoxymethanol, and compounds with higher carbon numbers; compounds with a formula $C_{2m}H_{4m}O_m$ (m>0), such as [m=1]ethylene oxide, [m=2] 1,1-dimethoxyethene, 1,2-dimethoxyethene, 1,3-dioxane, 1,4-dioxane, 2-(vinyloxy)ethanol, 2-(methoxymethyl)oxirane, 2-ethoxyoxirane, 2-methyl-1,3-dioxolane, 4-methyl-1,3-dioxolane, 2-methyloxirane-2-methanol, 3-methyloxirane-2-methanol, 2-methoxypropanal, 3-methoxypropanal, 3-oxetanemethanol, 3-methoxy-2-propen-1-ol, α-methyloxirane-2-methanol, formic acid propyl, formic acid isopropyl ester, ethoxyacetaldehyde, oxirane-2-ethanol, oxetane-2-methanol, tetrahydrofuran-2-ol, tetrahydrofuran-3-ol, propionic acid methyl, methoxyacetone, ethyl acetate, and compounds with higher carbon numbers; compounds with a formula $C_{2m}H_{4m-2}O_m$ (m>0), such as [m=1] oxirene, [m=2] 3-methyloxirane-2-carbaldehyde, 3-methyloxetane-2-one, β-butyrolactone, α-butyrolactone, γ-butyrolactone, 1,4-dioxaspiro[2.3]hexane, 1-(oxiranyl)ethanone, 2,3-dihydro-1,4-dioxin, 2,3-dihydro-3-hydroxyfuran, 2-acetyloxirane, 2-hydroxy-4,5-dihydrofuran, 2-methyl-2-oxiranecarbaldehyde, 2-methylene-1,3-dioxolane, 2-methylene-3-methoxyoxirane, 2-methoxy-1-oxa-2-cyclobutene, 2-methoxyacrylaldehyde, 3,3-dimethyloxirane-2-one, 3,6-dioxabicyclo[3.1.0]hexane, 3-methoxypropenal, 4H-1,3-dioxin, 4-methylene-1,3-dioxolane, formic acid 1-propen-2-yl ester, formic acid allyl, acrylic acid methyl, ethoxyketene, diepoxybutane, dimethoxyethyne, tetrahydrofuran-3-one, vinyl acetate, and compounds with higher carbon numbers; compounds with a formula $C_{2m}H_{4m-4}O_m$ (m>1), such as [m=2] 1,4-dioxin, 2(5H)-furanone, 3(2H)-furanone, 2,4-dimethylene-1,3-dioxetane, 2-methyleneoxetane-3-one, 3-hydroxy-2-butenoic acid 1,3-lactone, formic acid 2-propynyl ester, diketene, furan-2(3H)-one, furan-2-ol, propiolic acid methyl ester, and compounds with higher carbon numbers; compounds with a formula $C_{2m}H_{4m-6}O_m$ (m>1), such as [m=2] 1,2:3,4-diepoxy-1,3-butadiene, 3-oxa-1-pentene-4-yne-1-one, and compounds with higher carbon numbers; compounds with a formula $C_{2m}O_m$ (m>2), such as [m=3] 1,4,7-trioxacyclonona-2,5,8-triyne, 3,6,9-trioxatetracyclo[6.1.0.0$^{2,4}$.0$^{5,7}$] nona-1(8),2(4),5(7)-triene, and compounds with higher carbon numbers.

Of compounds containing C and O atoms in a ratio of 2:1, with respect to those containing a plurality of O atoms in a single molecule, to prevent an O atom from being introduced in isolation, it is preferable that the compounds be composed of a combination of a plurality of atomic groups, namely at least an atomic group C—O—C and another atomic group C*C*O or C—O—C. Accordingly, it is particularly preferable to select, from the molecules enumerated above, those which have a structure as just mentioned.

In the embodiments described above, the organic compound source material for producing the p-type semiconductor crystal is supplied into the furnace through a group V line. This however is not meant to limit the way it is supplied; it may instead be supplied through a group III line. How it is supplied is not particularly essential to the present invention. Depending on the design of the MOCVD machine, a group V source material and a group III source material may be supplied not through separate lines but through a single line. In that case, the organic compound source material for producing the p-type semiconductor crystal can be supplied through the common line. Depending on the design of the MOCVD machine, there may be provided a dedicated line for supplying a dopant source material into the furnace. Also in that case, the present invention is effective.

To follow is a summary of embodiments of the present invention. According to one aspect of the present invention, a method of producing a nitride semiconductor crystal includes a step of obtaining p-type conductivity by introducing C and O atoms simultaneously into the crystal by a metal organic chemical vapor deposition process using as source materials an organic metal compound of a group III element, a hydride of nitrogen, and an organic compound having any of the partial structures C—C—O, C—C═O, C═C—O, C═C═O, C≡C—O, and C—O—C.

With this configuration, both C and O atoms in the organic compound source material for producing a p-type semiconductor crystal are reliably introduced into N atom sites where the atoms are to act as an acceptor and a donor respectively. Thus, it is possible to provide a method of producing a p-type nitride semiconductor crystal by a metal organic chemical vapor deposition process with good controllability.

In the above production method, the supply ratio of the organic metal compound and the hydride of nitrogen may be varied cyclically, and synchronously therewith the supply quantity of the organic compound may be varied.

With this configuration, both C and O atoms in the organic compound source material for producing a p-type semiconductor crystal are more reliably introduced into N atom sites where the atoms are to act as an acceptor and a donor respectively. This effectively activates the mechanism that enables good p-type controllability.

Specifically, in one preferred way, as a result of the supply ratio being varied cyclically, a first period during which a group III element is preferentially deposited on the growing crystal surface and a second period during which nitrogen atoms are preferentially deposited on the growing crystal surface alternate, and synchronously with the second period, the organic compound is supplied, or the supply quantity of the organic compound is increased.

With this configuration, in the second period, the organic compound source material for producing a p-type semiconductor crystal is substantially supplied, and C and O atoms contained in it are introduced into N atom sites.

In another preferred way, as a result of the supply ratio being varied cyclically, a first period during which a group III element is preferentially deposited on the growing crystal surface and a second period during which nitrogen atoms are preferentially deposited on the growing crystal surface alternate, and from between a first period and the subsequent second period to before the second period, or from between a first period and the subsequent second period to between the second period and the subsequent first period, the organic compound is supplied, or the supply quantity of the organic compound is increased.

With this configuration, between the first and second periods, that is, prior to the period in which nitrogen atoms are preferentially deposited on the growth surface, the organic compound source material for producing the p-type semiconductor crystal is supplied to the crystal surface to which group III atoms have sufficiently been supplied, and C and O atoms contained in the organic compound source material are introduced into N atom sites.

In the above production method, it is preferable that the organic compound be supplied to a crystal growth machine in a state diluted with hydrogen or an inert gas. This is because if the organic compound is supplied in a high concentration, before it reaches the substrate 11, reaction within itself prevents proper doping from taking place.

In the above production method, it is preferable that the organic compound be diluted in a ratio of 0.01 ppm to 10000 ppm.

In the above production method, it is preferable that the organic compound be any of organic compounds with formulae $C_nH_{2n}O$ (n>1), $C_nH_{2n-2}O$ (n>1), $C_nH_{2n-4}O$ (n>2), $C_nH_{2n-4}O$ (n>3), $C_nH_{2n}O_2$ (n>1), $C_nH_{2n-2}O_2$ (n>1), $C_nH_{2n-4}O_2$ (n>2), $C_nH_{2n-6}O_2$ (n>2), and $C_nH_{2n-6}O_2$ (n>3). This is because an O atom is then significantly less likely to be introduced in isolation whereas, when introduced in isolation, an O atom acts as a donor and cancels out p-type conductivity.

In the above production method, it is preferable that the organic compound contain C and O atoms in a ratio of 2:1. This is because that is the ratio of atoms necessary to cause the mechanism according to the present invention to take place in the crystal.

Specifically, preferred as an organic compound containing C and O atoms in a ratio of 2:1 is any of organic compounds with formulae $C_{2m}H_{4m+2}O_m$ (m>0), $C_{2m}H_{4m}O_m$ (m>0), $C_{2m}H_{4m-2}O_m$ (m>0), $C_{2m}H_{4m-4}O_m$ (m>1), $C_{2m}H_{4m-6}O_m$ (m>1), $C_{2m}O_m$ (m>0), and $C_{2m}O_m$ (m>2). In particular, in cases where a single molecule contains a plurality of O atoms, to prevent an O atom from being introduced in isolation, it is preferable that the composition be a combination of a plurality of atomic groups, namely at least an atomic group C—O—C and another atomic group C*C*O or C—O—C.

In the above production method, it is preferable that the organic compound be acetaldehyde.

In the above production method, it is preferable that the organic compound have a cyclic partial structure including C—O—C. This makes it extremely unlikely that an O atom is introduced in isolation during crystal growth, and the effect of molecular doping is exerted more effectively.

In the above production method, it is preferable that the cyclic partial structure including C—O—C consist of three atoms C, O, and C. This is because, since two C atoms and one O atom are cyclically bonded together, such a structure is effective in causing the mechanism of introducing two C atoms and one O atom into neighboring sites to take place.

In the above production method, it is preferable that the organic compound be a compound having two C atoms and one O atom. This is particularly suitable to permit a set of two C atoms and one O atom to be introduced into neighboring sites According to another aspect of the present invention, a nitride semiconductor crystal is produced by the production method described above.

In the above nitride semiconductor crystal, it is preferable that a group of atoms C, C, and O be introduced so as to be disposed at neighboring N atom sites.

In the above nitride semiconductor crystal, it is preferable that a group of atoms C, C, and O be introduced so as to be disposed at neighboring N atom sites but away from another group of atoms C, C, and O disposed at neighboring N atom sites.

According to yet another aspect of the present invention, a semiconductor device is provided with the nitride semiconductor crystal described above.

The present invention finds applications in electronic devices, such as light receiving and emitting devices (LEDs, semiconductor lasers, photodiodes, superluminescent diodes, phototransistors, solar cells, etc.), electronic devices other than light receiving and emitting devices (diodes, transistors, bipolar electronic devices, unipolar electronic devices, integrated devices, etc.), spintronics devices, photocatalyst devices, and electron tubes, and in semiconductor substrates, laser media, magnetic semiconductors, phosphors (luminescent, i.e. phosphorescent and fluorescent, materials), etc.

LIST OF REFERENCE NUMERALS 11 substrate
12 nitride semiconductor layer
13 p-type nitride semiconductor layer
20 MOCVD machine
21 furnace
22 stage

What is claimed is:

1. A method of producing a nitride semiconductor crystal containing Ga, comprising a step of obtaining p-type conductivity by introducing C and O atoms simultaneously into the crystal by a metal organic chemical vapor deposition process using as source materials an organic metal compound of a group III element, a hydride of nitrogen, and an organic compound comprising one of partial structures C—C—O, C—C=O, C=C—O, C=C=O, C≡C—O, and C—O—C and containing no Mg.

2. The method according to claim 1, wherein a supply ratio of the organic metal compound and the hydride of nitrogen is varied cyclically, and synchronously therewith a supply quantity of the organic compound is varied.

3. The method according to claim 2, wherein
as a result of the supply ratio being varied cyclically, a first period during which a group III element is preferentially deposited on a growing crystal surface and a second period during which nitrogen atoms are preferentially deposited on the growing crystal surface alternate, and
synchronously with the second period, the organic compound is supplied, or the supply quantity of the organic compound is increased.

4. The method according to claim 2, wherein
as a result of the supply ratio being varied cyclically, a first period during which a group III element is preferentially deposited on a growing crystal surface and a second period during which nitrogen atoms are preferentially deposited on the growing crystal surface alternate, and
from between a first period and a subsequent second period to before the second period, or from between a first period and a subsequent second period to between the second period and a subsequent first period, the organic compound is supplied, or the supply quantity of the organic compound is increased.

5. The method according to claim 1, wherein the organic compound is supplied to a crystal growth machine in a state diluted with hydrogen or an inert gas.

6. The method according to claim 5, wherein the organic compound is diluted in a ratio of 0.01 ppm to 10000 ppm.

7. The method according to claim 1, wherein the organic compound is any of organic compounds with formulae $C_nH_{2n}O$ (n>1), $C_nH_{2n-2}O$ (n>1), $C_nH_{2n-4}O$ (n>2), $C_nH_{2n-6}O$ (n>3), $C_nH_{2n}O_2$ (n>1), $C_nH_{2n-2}O_2$ (n>1), $C_nH_{2n-4}O_2$ (n>2), and $C_nH_{2n-6}O_2$ (n>2).

8. The method according to claim 1, wherein the organic compound contains C and O atoms in a ratio of 2:1.

9. The method according to claim 8, wherein the organic compound is any of organic compounds with formulae $C_{2m}H_{4m+2}O_m$ (m>0), $C_{2m}H_{4m}O_m$ (m>0), $C_{2m}H_{4m-2}O_m$ (m>0), $C_{2m}H_{4m-4}O_m$ (m>1), $C_{2m}H_{4m-6}O_m$ (m>1), and $C_{2m}O_m$ (m>0).

10. The method according to claim 1, wherein the organic compound is acetaldehyde.

11. The method according to claim 1, wherein the organic compound has a cyclic partial structure including C—O—C.

12. The method according to claim 11, wherein the cyclic partial structure including C—O—C consists of three atoms C, O, and C.

13. The method according to claim 1, wherein the organic compound is a compound having two C atoms and one O atom.

14. A nitride semiconductor crystal produced by the method according to claim 1.

15. The nitride semiconductor crystal according to claim 14, wherein a group of atoms C, C, and O is introduced so as to be disposed at neighboring N atom sites.

16. The nitride semiconductor crystal according to claim 14, wherein a group of atoms C, C, and O is introduced so as to be disposed at neighboring N atom sites but away from another group of atoms C, C, and O disposed at neighboring N atom sites.

17. A semiconductor device comprising the nitride semiconductor crystal according to claim 14.

18. A method of producing a nitride semiconductor crystal containing Ga, comprising a step of obtaining p-type conductivity by introducing C and O atoms simultaneously into the crystal by a metal organic chemical vapor deposition process using as source materials an organic metal compound of a group III element, a hydride of nitrogen, and an organic compound comprising one of partial structures C—C—O, C—C=O, C=C—O, C=C=O, C≡C—O, and C—O—C and composed only of C and O or only of C, O, and H.

* * * * *